United States Patent
Kabe et al.

(10) Patent No.: US 11,719,768 B2
(45) Date of Patent: Aug. 8, 2023

(54) MAGNETIC SENSOR AND MAGNETIC SENSOR DEVICE

(71) Applicant: SHOWA DENKO K.K., Tokyo (JP)

(72) Inventors: Isao Kabe, Ichihara (JP); Hiroyuki Tomita, Ichihara (JP)

(73) Assignee: SHOWA DENKO K.K., Tokyo (JP)

(*) Notice: Subject to any disclaimer, the term of this patent is extended or adjusted under 35 U.S.C. 154(b) by 0 days.

(21) Appl. No.: 17/691,504

(22) Filed: Mar. 10, 2022

(65) Prior Publication Data

US 2022/0308127 A1    Sep. 29, 2022

(30) Foreign Application Priority Data

Mar. 24, 2021  (JP) ................................ 2021-050698
Mar. 24, 2021  (JP) ................................ 2021-050700

(51) Int. Cl.
*G01R 33/06*    (2006.01)
*G01R 33/00*    (2006.01)

(52) U.S. Cl.
CPC ....... *G01R 33/063* (2013.01); *G01R 33/0023* (2013.01)

(58) Field of Classification Search
CPC .............. G01R 33/063; G01R 33/0023; G01R 33/0052; G01R 33/0005; G01R 33/001
USPC ....................................................... 324/262
See application file for complete search history.

(56) References Cited

U.S. PATENT DOCUMENTS

| | | | | |
|---|---|---|---|---|
| 4,052,749 A | * | 10/1977 | Nomura | G11B 5/31 360/125.33 |
| 4,918,824 A | * | 4/1990 | Farrar | G01C 17/28 324/254 |
| 5,128,614 A | * | 7/1992 | Schewe | G01R 33/02 324/249 |
| 5,473,491 A | * | 12/1995 | Fujisawa | G11B 5/312 360/125.58 |
| 5,831,432 A | * | 11/1998 | Mohri | G01R 33/022 324/249 |
| 5,889,403 A | * | 3/1999 | Kawase | G01R 33/02 360/110 |
| 6,472,868 B1 | | 10/2002 | Takayama et al. | |
| 7,298,140 B2 | * | 11/2007 | Honkura | G01R 33/02 324/249 |
| 7,318,352 B2 | * | 1/2008 | Mohri | G01L 1/125 73/779 |
| 2003/0006763 A1 | | 1/2003 | Takayama et al. | |

FOREIGN PATENT DOCUMENTS

JP       2000-292506 A    10/2000

* cited by examiner

*Primary Examiner* — Christopher P McAndrew
(74) *Attorney, Agent, or Firm* — Sughrue Mion, PLLC

(57) ABSTRACT

A magnetic sensor 10 includes: a non-magnetic substrate 11; a sensitive circuit 12 provided on a surface of the substrate 11 and including a sensitive part 121 sensing a magnetic field by a magnetic impedance effect; a terminal part 13a and a terminal part 13b connected to respective both end portions of the sensitive circuit 12; and a conductive returning member with one end portion being connected to the terminal part 13a, the returning member returning back toward the terminal part 13b.

15 Claims, 13 Drawing Sheets

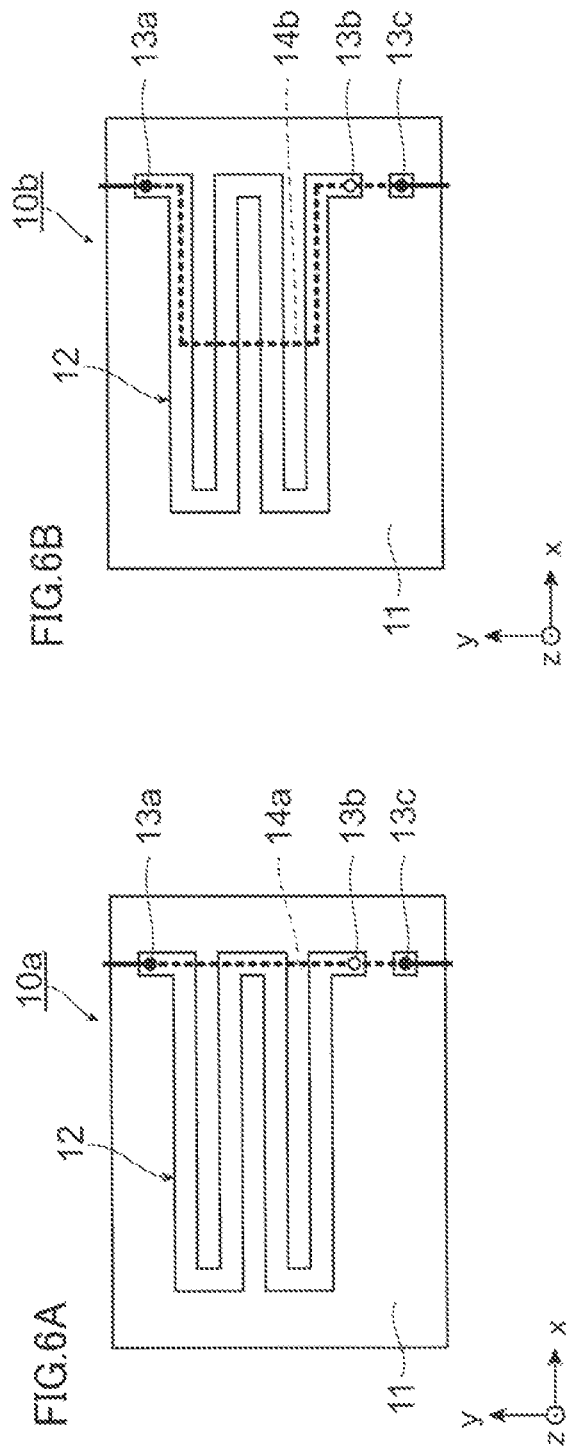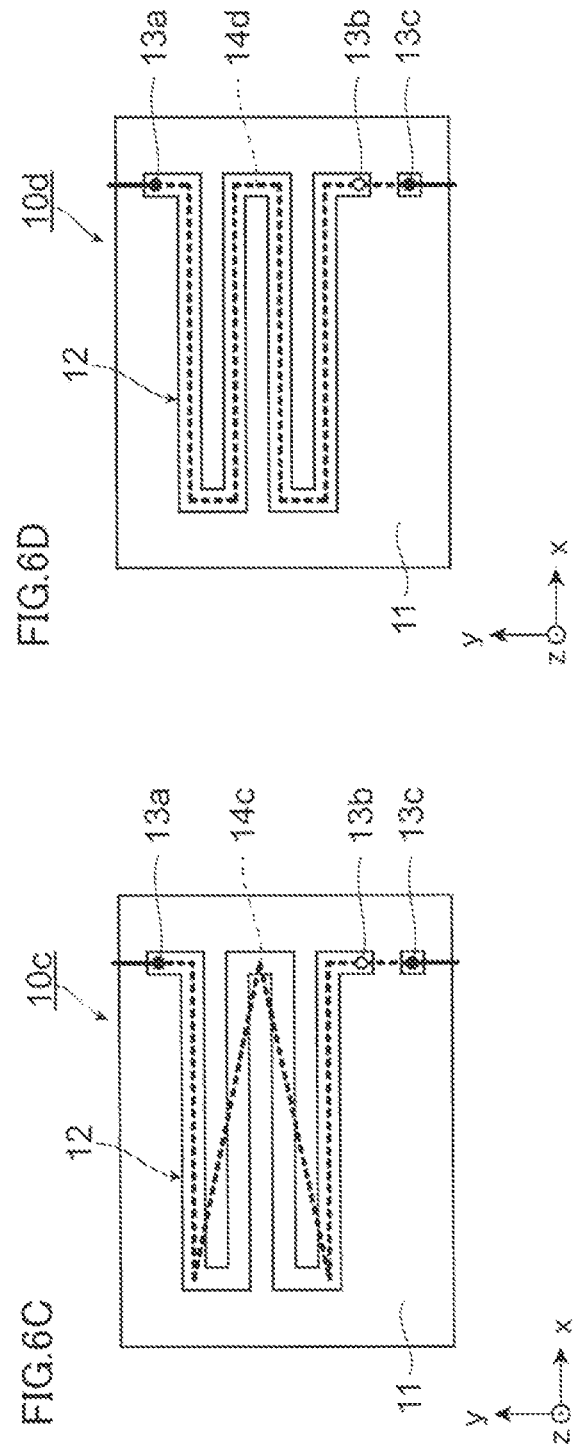

MAGNETIC SENSOR AND MAGNETIC SENSOR DEVICE

CROSS REFERENCE TO RELATED APPLICATIONS

This application is based on and claims priority under 35 USC § 119 to Japanese Patent Applications Nos. 2021-050698 and 2021-050700, both filed Mar. 24, 2021, the disclosure is incorporated herein by reference in its entirety.

BACKGROUND

Technical Field

The present invention relates to a magnetic sensor and a magnetic sensor device.

Related Art

As a related art described in a gazette, there is a magnetic impedance element including a substrate made of a non-magnetic material, a thin-film magnetic core formed on the substrate, and first and second electrodes disposed on both ends of the thin-film magnetic core in a longitudinal direction, wherein at least two thin-film magnetic cores are disposed in parallel and electrically connected in series with each other (refer to Japanese Patent Application Laid-Open Publication No. 2000-292506).

In a magnetic sensor using a sensitive part sensing the magnetic field by the magnetic impedance effect and a magnetic sensor device including the magnetic sensor, the change in the impedance is detected by a detection part and converted into the magnetic field strength. However, since the wire connecting the magnetic sensor and the detection part also has the impedance, if the impedance of the wire is large, the rate of change of the impedance caused by the magnetic field is reduced, and thereby the sensitivity is deteriorated.

An object of the present invention is to improve sensitivity in a magnetic sensor using a sensitive part sensing a magnetic field by a magnetic impedance effect and a magnetic sensor device including the magnetic sensor.

SUMMARY

A magnetic sensor to which the present invention is applied includes: a non-magnetic substrate; a sensitive circuit provided on a surface of the substrate and including a sensitive part sensing a magnetic field by a magnetic impedance effect; a first terminal part and a second terminal part connected to respective both end portions of the sensitive circuit; and a conductive returning member with one end portion being connected to the first terminal part, the returning member returning back toward the second terminal part.

In such a magnetic sensor, the returning member may be a wire configured with a non-magnetic metal.

Then, a third terminal part may be provided adjacent to the second terminal part, and the other end portion of the returning member may be connected to the third terminal part.

Further, a distance between a center of the second terminal part and a center of the third terminal part may be smaller than a distance between a center of the first terminal part and the center of the second terminal part.

In such a magnetic sensor, the returning member may be provided on a front side or a back side of the substrate.

Then, the returning member may be linearly provided from the first terminal part toward the second terminal part.

In addition, the returning member may have a portion crossing a center portion of the sensitive circuit in planar view.

Moreover, the returning member may be in an M shape, and may be provided to have at least a part overlapping the sensitive circuit in planar view.

Still further, the returning member may be provided along the sensitive circuit.

Moreover, in such a magnetic sensor, the returning member may be provided on the surface of the substrate.

Then, the returning member may be linearly provided from the first terminal part toward the second terminal part along a side surface of the sensitive circuit.

In addition, the returning member may be provided along the sensitive circuit.

Further, in such a magnetic sensor, the returning member may be another sensitive circuit including another sensitive part sensing a magnetic field by a magnetic impedance effect.

Moreover, a magnetic sensor device to which the present invention is applied includes: a magnetic sensor sensing a magnetic field by a magnetic impedance effect; and a detection part detecting a change in impedance of the magnetic sensor, wherein an area of a current loop formed by a wire in a neighborhood of the magnetic sensor is smaller than an area of a current loop formed by a wire in a neighborhood of the detection part.

In such a magnetic sensor device, an inductance generated by the current loop formed by the wire in the neighborhood of the magnetic sensor and the current loop formed by the wire in the neighborhood of the detection part may be equal to or less than 50% of an inductance of the magnetic sensor.

According to the present invention, it is possible to improve sensitivity of a magnetic sensor using a sensitive part sensing a magnetic field by a magnetic impedance effect and sensitivity of a magnetic sensor device including the magnetic sensor.

BRIEF DESCRIPTION OF THE DRAWINGS

Exemplary embodiments of the present invention will be described in detail based on the following figures, wherein:

FIG. 1A shows a magnetic sensor device using a magnetic sensor to which a first exemplary embodiment is applied, and FIG. 1B shows, for a comparative purpose, a magnetic sensor device using a magnetic sensor to which the first exemplary embodiment is not applied;

FIG. 3A is a plan view and FIG. 3B is a cross-sectional view along the IIIB-IIIB line in FIG. 3A;

FIG. 5A is a perspective view, and FIG. 5B is a side elevational view showing the magnetic sensor in FIG. 5A from the x direction;

FIGS. 6A to 6D are diagrams showing variations of the magnetic sensor to which the first exemplary embodiment is applied;

FIG. 8A shows a relation between the area of the current loop and the sensitivity, and FIG. 8B shows a relation between the spacing between the magnetic sensor and the wire and the sensitivity;

FIG. 9A shows the sensitivity measured in two samples having the same structure, and FIG. 9B shows the sensitivity measured in two samples having different structures;

FIG. 10A is a perspective view, and FIG. 10B is a side elevational view showing the magnetic sensor in FIG. 10A from the x direction;

FIG. 11A is a perspective view, and FIG. 11B is a side elevational view showing the magnetic sensor in FIG. 11A from the x direction;

DETAILED DESCRIPTION

Hereinafter, exemplary embodiments according to the present invention will be described with reference to attached drawings.

First Exemplary Embodiment (Magnetic Sensor Device 1)

Figure 1A:
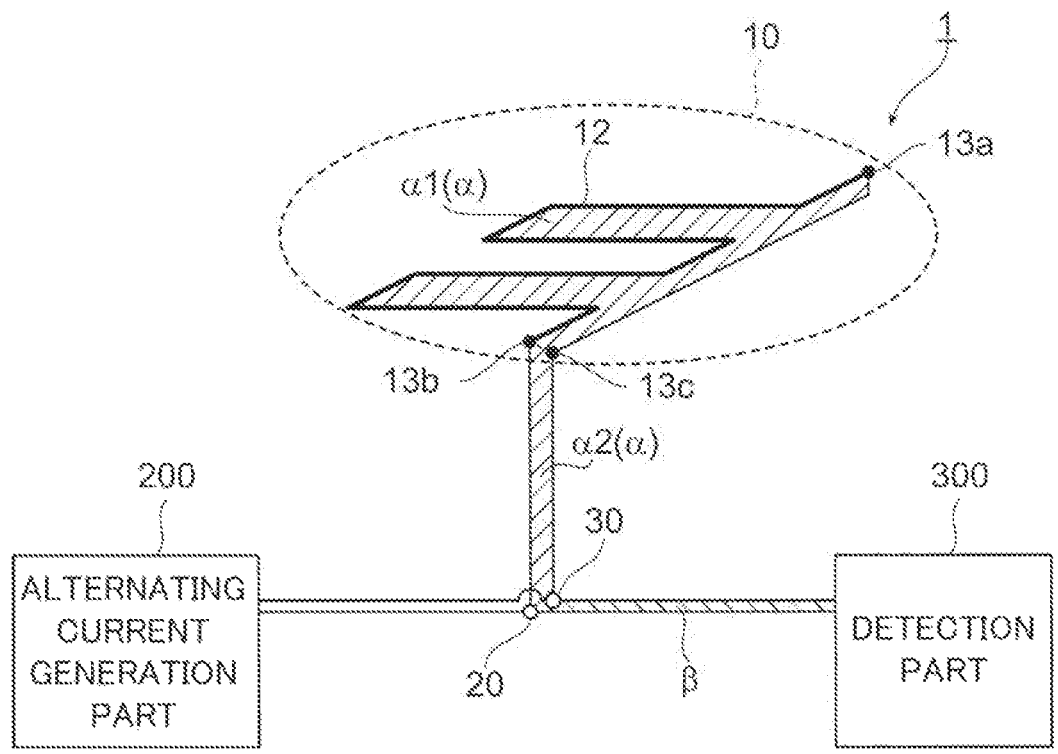
FIGS. 1A and 1B show diagrams illustrating a magnetic sensor device measuring the magnetic field by a magnetic sensor, where
Figure 1B:
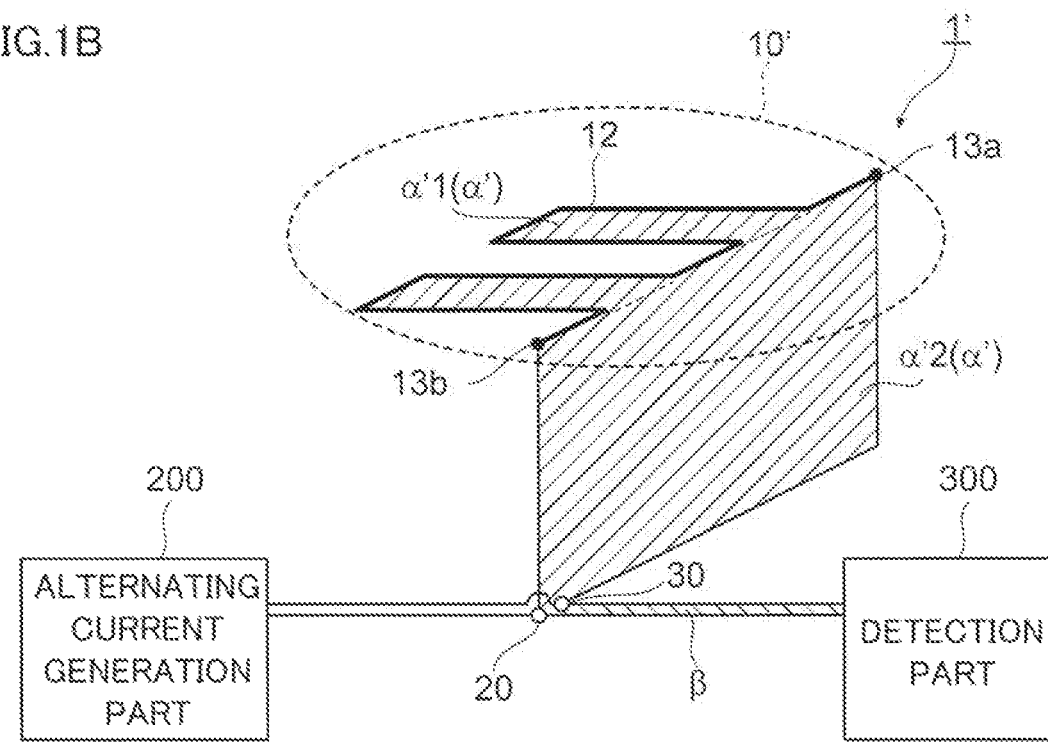

FIGS. 1A and 1B show diagrams illustrating a magnetic sensor device 1 measuring a magnetic field by a magnetic sensor 10. FIG. 1A shows the magnetic sensor device 1 using the magnetic sensor 10 to which the first exemplary embodiment is applied, and FIG. 1B shows, for a comparative purpose, a magnetic sensor device 1' using a magnetic sensor 10' to which the first exemplary embodiment is not applied. In the case where the magnetic sensors are not distinguished, each of these is referred to as the magnetic sensor.

As shown in FIG. 1A, the magnetic sensor device 1 using the magnetic sensor 10 to which the first exemplary embodiment is applied, includes the magnetic sensor 10 sensing the magnetic field, an alternating current generation part 200, and a detection part 300. The magnetic sensor 10 is connected to the alternating current generation part 200 and the detection part 300 via connection terminals 20 and 30, respectively. The magnetic sensor 10 is provided with sensitive parts 121 (refer to FIG. 3A to be described later), in which the impedance changes due to change in the magnetic field based on the magnetic impedance effect.

The alternating current generation part 200 includes a circuit that generates a current containing a high-frequency component (hereinafter, referred to as high-frequency current) and supplies the high-frequency current to the magnetic sensor 10. Note that the high frequency is, for example, 20 MHz or more.

The detection part 300 includes a circuit that detects changes in the impedance of the magnetic sensor 10. Specifically, the detection part 300 detects changes in inductance, amplitude in impedance, and changes in the phase of the magnetic sensor 10.

FIG. 1A shows a current loop α formed between the magnetic sensor 10 and the connection terminals 20 and 30, and a current loop β formed between the connection terminals 20 and 30 and the detection part 300. Note that the current loop α is the current loop formed by a wire in the neighborhood of the magnetic sensor 10, and the current loop β is the current loop formed by a wire in the neighborhood of the detection part 300. Hereinafter, the current loop α is referred to as the current loop α formed by the wire in the neighborhood of the magnetic sensor 10, and the current loop β is referred to as the current loop β formed by the wire in the neighborhood of the detection part 300. The current loop, which is the addition of the current loop α and the current loop β, is the current loop surrounded by the magnetic sensor 10 and the detection part 300. The current loop functions as an inductance. Then, as the area of the current loop is increased, the inductance is also increased.

Then, the current loop α formed by the wire in the neighborhood of the magnetic sensor 10 is configured with a current loop α1 in the magnetic sensor 10 and a current loop α2 between the magnetic sensor 10 and the connection terminals 20 and 30. Therefore, in FIG. 1A, the current loop α1 and the current loop α2 are referred to as α1(α) and α2(α), respectively.

As shown in FIG. 1B, the magnetic sensor device 1' using the magnetic sensor 10', to which the first exemplary embodiment is not applied, is the same as the magnetic sensor device 1 using the magnetic sensor 10, to which the first exemplary embodiment is applied, except for a current loop α' formed by a wire in the neighborhood of the magnetic sensor 10'. Accordingly, similar portions will be assigned with same reference signs, to thereby omit descriptions thereof. The area of the current loop α' formed by the wire in the neighborhood of the magnetic sensor 10' is larger than the area of the current loop α formed by the wire in the neighborhood of the magnetic sensor 10 shown in FIG. 1A. Note that the current loop α' is configured with a current loop α'1 in the magnetic sensor 10' and a current loop α'2 between the magnetic sensor 10' and the connection terminals 20 and 30. Therefore, in FIG. 1B, the current loop α'1 and the current loop α'2 are referred to as α'1(α') and α'2(α'), respectively.

The area of the current loop α'1 in the magnetic sensor 10' shown in FIG. 1B is not much different from the current loop α1 in the magnetic sensor 10 shown in FIG. 1A. Consequently, the area of the current loop α' formed by the wire in the neighborhood of the magnetic sensor 10' is larger than the area of the current loop α formed by the wire in the neighborhood of the magnetic sensor 10 only because the area of the current loop α'2 between the magnetic sensor 10' and the connection terminals 20 and 30 is larger than that of the current loop α2.

Note that, when the magnetic sensors 10 and the magnetic sensor 10' are not distinguished, each of these is referred to as the magnetic sensor in some cases. In the case where the current loops α, α', and β are not distinguished, each of these is referred to as the current loop in some cases. Then, terminal parts 13a, 13b and 13c shown in FIGS. 1A and 1B will be explained in FIG. 3A, which will be described later.

Here, description will be given of effects of the inductance by the current loop on the change in the inductance of the magnetic sensor device 1. Note that the description will be given by taking the magnetic sensor 10 and the magnetic sensor device 1 shown in FIG. 1A as an example.

It is assumed that the inductance of the magnetic sensor 10 when the signal magnetic field is not applied is L1, and the amount of change in the inductance of the magnetic sensor 10 when the signal magnetic field is applied is ΔL1. Then, it is assumed that the inductance generated by the current loop α formed by the wire in the neighborhood of the magnetic sensor 10 and the current loop β formed by the wire in the neighborhood of the detection part 300 is L2. Note that the signal magnetic field is a magnetic field that is applied from the outside to the magnetic sensor 10 to explain the operation of the magnetic sensor 10. When the signal magnetic field is applied to the magnetic sensor 10, the impedance of the magnetic sensor 10 changes against the case where the signal magnetic field is not applied.

The inductance in the state where the signal magnetic field is not applied is L1+L2. The inductance in the state where the signal magnetic field is applied is L1+ΔL1+L2. Therefore, due to the application of the signal magnetic field, the rate of change in the inductance detected by the detection part 300 is (L1+ΔL1+L2)/(L1+L2). Consequently, as the inductance L2 is reduced, the rate of change in the inductance is increased. To put it another way, as the inductance L2 is reduced, the rate of change in the inductance is increased, and the sensitivity to detect the magnetic field is improved. In other words, reduction in the inductance L2 generated by the current loop α formed by the wire in the neighborhood of the magnetic sensor 10 and the current loop β formed by the wire in the neighborhood of the detection part 300 improves the sensitivity of the magnetic sensor 10.

Figure 2:
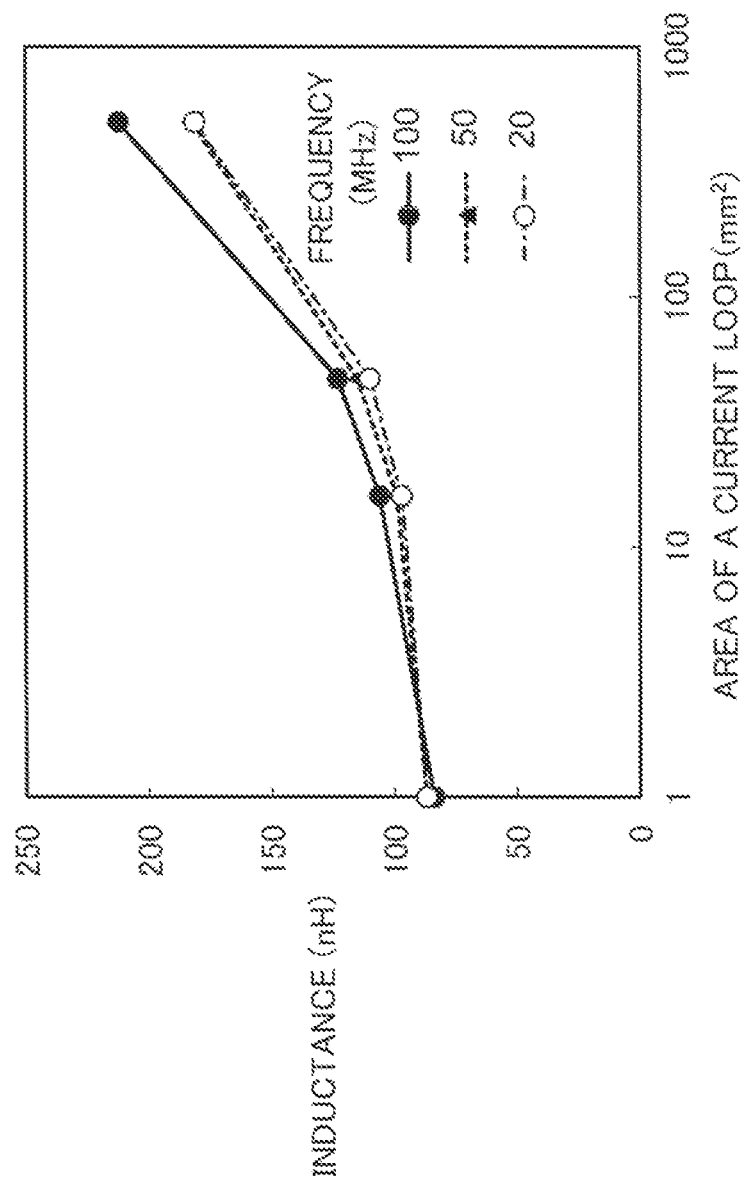
FIG. 2 shows, in the magnetic sensor shown in FIG. 1B, a relation between an area of a current loop formed by a wire in the neighborhood of the magnetic sensor and an inductance.

FIG. 2 shows, in the magnetic sensor 10' shown in FIG. 1B, a relation between an area of a current loop α' formed by a wire in the neighborhood of the magnetic sensor 10' and an inductance generated by the magnetic sensor 10' and the current loop α'. The horizontal axis is the area of the current loop α' (in FIG. 2, the area of the current loop (mm$^2$)), and the vertical axis is the inductance (nH). Here, the inductance was measured by connecting the terminal part 13a and the terminal part 13b of the magnetic sensor 10, shown in FIG. 3 to be described later, to an impedance measuring device. At this time, the area surrounded by the wire connecting the terminal part 13a and the terminal part 13b to the impedance measuring device was changed. In FIG. 2, the frequencies at which the inductance is measured were set at 20 MHz, 50 MHz, and 100 MHz. Note that, in FIG. 2, since the area of the current loop α'1 in the magnetic sensor 10' is smaller than the area of the current loop α'2 between the magnetic sensor 10' and the connection terminals 20 and 30, the area of the current loop α'1 was set at 0 mm$^2$.

As shown in FIG. 2, the inductance generated by the magnetic sensor 10' and the current loop α' is increased as the area of the current loop α' is increased. In addition, the inductance generated by the magnetic sensor 10' and the current loop α' is increased as the frequency is increased. In other words, as the area of the current loop α' is reduced, the inductance can also be reduced. Note that, though the description is given for the area of the current loop α' in FIG. 2, the area may be considered as the sum of the area of the current loop α' formed by the wire in the neighborhood of the magnetic sensor 10' and the area of the current loop β' formed by the wire in the neighborhood of the detection part 300. Hereinafter, description will be given by referring to the area of the current loop α' as the area of the current loop.

Here, the inductance of the magnetic sensor 10' corresponding to the area of the current loop 0 mm$^2$ (equivalent to L1) is about 85 nH. As shown in FIG. 2, the inductance with the area of the current loop 16 mm$^2$ (equivalent to L1+L2) is 101 nH, which is the average value of the cases of frequencies 20 MHz, 50 MHz, and 100 MHz, and is 1.2 times the inductance of the magnetic sensor 10. In addition, the inductance with the area of the current loop 47 mm$^2$ (equivalent to L1+L2) is 116 nH, which is the similar average value, and is 1.4 times the inductance of the magnetic sensor 10. As will be described in FIGS. 8A and 8B later, the area of the current loop is preferably 50 mm$^2$ or less, and more preferably, 16 mm$^2$ or less. Then, it is preferable that the inductance L2 is equal to or less than 50% of the inductance L1, and more preferable that the inductance L2 is equal to or less than 20% of the inductance L1.

Note that the detection part 300 may detect the change in the impedance including the inductance L, the resistance R, and the capacitance C instead of detecting the change in the inductance of the above-described magnetic sensor 10. For example, the detection part 300 may include a circuit that detects the amplitude and phase of the impedance. In this case, the impedance Z is represented as $Z=R+j\omega L+1/(j\omega C)=R+jX$. The amplitude $|Z|$ is represented as $|Z|=\sqrt{(R^2+X^2)}$, and the phase θ is represented as $\theta=\tan^{-1}(X/R)$. Here, ω is the angular frequency, and X is the reactance.

The area of the magnetic sensor 10' (equivalent to the magnetic sensor 10 shown in FIG. 3A to be described later) is more likely to be larger than the area of the electronic components constituting the alternating current generation part 200 and the detection part 300. Accordingly, as shown in FIG. 1B, the area of the current loop α' formed by the wire in the neighborhood of the magnetic sensor 10' is more likely to be larger than the area of the current loop β formed by the wire in the neighborhood of the detection part 300. Therefore, it is preferable to reduce the current loop α' formed by the wire in the neighborhood of the magnetic sensor 10'. However, since the current loop α'1 in the magnetic sensor 10' is determined by the shape of the magnetic sensor 10', it is difficult to reduce the area of the current loop α'1 in the magnetic sensor 10'. In addition, the area of the current loop α'2 between the magnetic sensor 10 and the connection terminals 20 and 30 is more likely to be larger than the area of the current loop α'1 in the magnetic sensor 10'.

Consequently, in the magnetic sensor 10 to which the first exemplary embodiment is applied and the magnetic sensor device 1 (FIG. 1A), in the current loop α formed by the wire in the neighborhood of the magnetic sensor 10, the area of the current loop α2 between the magnetic sensor 10 and the connection terminals 20 and 30 is made smaller than the area of the current loop α'2 between the magnetic sensor 10', to which the first exemplary embodiment is not applied, and the connection terminals 20 and 30 in the current loop α' formed by the wire in the neighborhood of the magnetic sensor 10' and the magnetic sensor device 1' (FIG. 1B).

(Magnetic Sensor 10)

Here, the magnetic sensor 10 will be described.

Figure 3A:
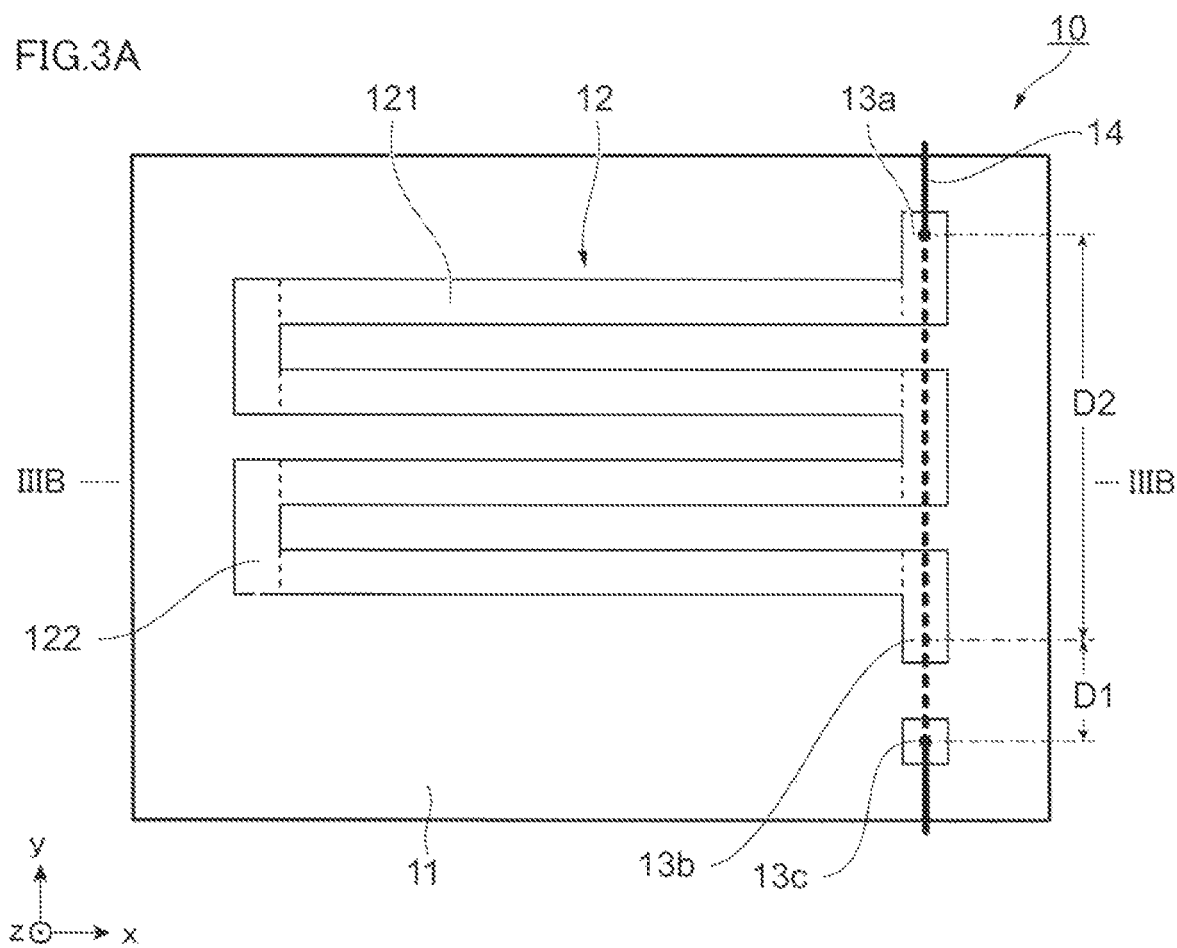
FIGS. 3A and 3B show diagrams illustrating an example of a magnetic sensor to which the first exemplary embodiment is applied, where
Figure 3B:
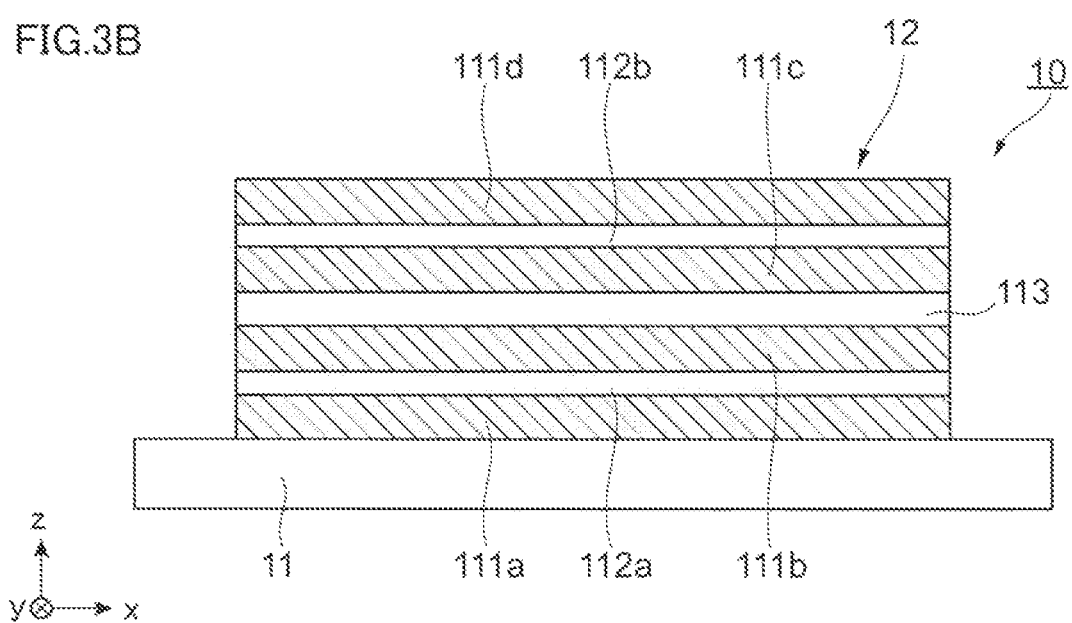

FIGS. 3A and 3B show diagrams illustrating an example of the magnetic sensor 10 to which the first exemplary embodiment is applied, and an example of the magnetic sensor device including the magnetic sensor 10. FIG. 3A is a plan view and FIG. 3B is a cross-sectional view along the IIIB-IIIB line in FIG. 3A. In FIG. 3A, the right direction of the page is the +x direction, the upward direction of the page is the +y direction, and the front side direction of the page is the +z direction. In FIG. 3B, the right direction of the page is the +x direction, the upward direction of the page is the +z direction, and the backside direction of the page is the +y direction.

Description will be given of a planar structure of the magnetic sensor 10 by the plan view in FIG. 3A. The magnetic sensor 10 has a quadrangular planar shape as an example. The planar shape of the magnetic sensor 10 is several millimeters square to several tens of millimeters square. For example, the length in the +x direction is 3 mm to 20 mm, and the length in the y direction is 3 mm to 20 mm. Note that the size of the planar shape of the magnetic sensor 10 may be other values.

The magnetic sensor 10 includes a substrate 11, a sensitive circuit 12 and the terminal parts 13a, 13b, and 13c provided on the substrate 11, and a returning wire 14. The sensitive circuit 12 includes the plural sensitive parts 121 disposed in parallel, and connection parts 122 each serially connecting the sensitive parts 121 windingly (a meander structure). The terminal parts 13a and 13b are provided to one end portion and the other end portion of the sensitive circuit 12, respectively. The terminal part 13c is provided adjacent to the terminal part 13b on the substrate 11. The returning wire 14 is provided to route the back side of the substrate 11 along the back side, to thereby connect the terminal part 13a and the terminal part 13c. Note that, in FIG. 3A, the returning wire 14 hidden on the back side of the substrate 11 is indicated by a broken line. Here, the terminal part 13a is an example of the first terminal part, the terminal part 13b is an example of the second terminal part, the terminal part 13c is an example of the third terminal part, and the returning wire 14 is an example of a returning member.

The sensitive part 121 has a reed-like planar shape with a longitudinal direction and a short direction. It is assumed that, in the sensitive part 121 shown in FIG. 3A, the x direction is the longitudinal direction, and the y direction is the short direction. Then, in FIG. 3A, four sensitive parts 121 are disposed in parallel in the y direction. The sensitive part 121 reveals the magnetic impedance effect. Therefore, the magnetic sensor 10 or the sensitive circuit 12 is sometimes referred to as a magnetic impedance element. The sensitive part 121 is referred to as a sensitive element in some cases.

Each sensitive part 121 has, for example, the length in the longitudinal direction of 1 mm to 10 mm, and the width in the short direction of 50 µm to 150 µm. The thickness thereof is 0.2 µm to 5 µm. The spacings between the adjacent sensitive parts 121 are 50 µm to 150 µm. The number of sensitive parts 121 is four in FIG. 3A, but other numbers may be accepted.

Note that the size (the length, the area, the thickness, etc.) of each sensitive part 121, the number of sensitive parts 121, the spacings between the sensitive parts 121, or the like may be set in accordance with the magnitude of the magnetic field to be sensed, in other words, to be detected. Note that the number of the sensitive parts 121 may be one.

The connection part 122 is provided between end portions of the adjacent sensitive parts 121 to connect the plural sensitive parts 121 in series. In other words, the connection parts 122 are provided to windingly connect the adjacent sensitive parts 121. In the magnetic sensor 10 including the four sensitive parts 121 shown in FIG. 3A, there are three connection parts 122. The number of connection parts 122 differs depending on the number of sensitive parts 121. For example, if there are five sensitive parts 121, there are four connection parts 122. Moreover, if there is one sensitive part 121, no connection part 122 is provided. Note that the width of the connection part 122 may be set in accordance with the electrical current, etc., to be applied to the sensitive circuit 12. For example, the width of the connection part 122 may be the same as that of the sensitive part 121.

The terminal parts 13a and 13b are provided to one end portion and the other end portion of the sensitive circuit 12, respectively. In FIG. 3A, the terminal part 13a is provided on the upper side (on the y direction side) of the page, and the terminal part 13b is provided on the lower side (on the −y direction side) of the page. The terminal part 13c is provided on the lower side (on the −y direction side) of the terminal part 13b. In the case where the terminal parts 13a, 13b, and 13c are not distinguished, each of these is referred to as the terminal part 13. The terminal part 13 may have a size capable of connecting to the circuit. Note that, in the magnetic sensor 10 shown in FIG. 3A, since there are four sensitive parts 121, the terminal parts 13a and 13b are provided on the right side (on the +x direction side) of the page. In the case where the number of sensitive parts 121 is an odd number, the terminal parts 13a and 13b are divided to be provided into right and left sides (on the ±x direction sides) of the page. Note that the sensitive circuit 12 may be configured by horizontally flipping.

Then, the terminal part 13c is provided adjacent to the terminal part 13b. Here, the terminal part 13c is provided adjacent to the terminal part 13b on the −y direction side. The returning wire 14 connects the terminal part 13a and the terminal part 13c. In other words, the returning wire 14 is a wire that draws the terminal part 13a to the position adjacent to the terminal part 13b (the terminal part 13c). To put it another way, the returning wire 14 has conductivity and is provided to have a path, through which the current flows from the terminal part 13a to the terminal part 13b (hereinafter, referred to as a current path), that is returned back. Examples of the conductive material constituting the returning wire 14 include metals such as Au, Al, Cu, and Ag.

Then, the terminal parts 13b and 13c in the magnetic sensor 10 are connected to the connection terminals 20 and 30 of the alternating current generation part 200 and the detection part 300. In other words, the high-frequency current is supplied from the alternating current generation part 200 through the terminal parts 13b and 13c, and changes in the inductance, changes in the amplitude or the phase in the impedance, and so forth, are detected by the detection part 300.

Here, the magnetic sensor 10' shown in FIG. 1B does not include the terminal part 13c and the returning wire 14 of the magnetic sensor 10 shown in FIG. 3A. Consequently, as shown in FIG. 1B, in the magnetic sensor 10', the terminal part 13a and the terminal part 13b, which is located at the position away from the terminal part 13a, are connected to the connection terminals 20 and 30 of the alternating current generation part 200 and the detection part 300. On the other hand, in the magnetic sensor 10 shown in FIG. 1A, the terminal part 13c is provided adjacent to the terminal part 13b, and the returning wire 14 connects the terminal part 13a and the terminal part 13c by passing through the vicinity of the sensitive circuit 12. Then, the terminal part 13b and the terminal part 13c, which is adjacent to the terminal part 13b, are connected to the connection terminals 20 and 30 of the alternating current generation part 200 and the detection part 300. Therefore, the area of the current loop α'2 between the magnetic sensor 10' and the connection terminals 20 and 30 shown in FIG. 1B becomes larger than the area of the current loop α2 between the magnetic sensor 10 and the connection terminals 20 and 30 shown in FIG. 1A. That is, the magnetic sensor 10 to which the first exemplary embodiment is applied includes the terminal part 13c and the returning wire 14, and thereby the area of the current loop α2 is reduced. Here, D1 shown in FIG. 3A is the distance between the centers of the terminal part 13b and the terminal part 13c, and D2 is the distance between the centers of the terminal part 13a and the terminal part 13b. Note that, even in the case where the terminal 13a and terminal 13b are provided at positions of diagonally opposite corners of the magnetic sensor 10 (refer to FIG. 7A to be described later), the distance D2 is the distance between the centers of the terminal part 13a and the terminal part 13b positioned at the diagonally opposite corners.

In FIG. 3A, the terminal part 13c is provided on the lower side (the −y direction side) of the terminal part 13b; however, the terminal part 13c may be provided adjacent to the terminal part 13b. In other words, the terminal part 13c may be provided so that the distance D1 between the terminal part 13b and the terminal part 13c is shorter than the distance D2 between the terminal part 13a and the terminal part 13b (D1<D2). Therefore, the terminal part 13c may be provided adjacent to the terminal part 13b on the x direction side or the −x direction side, or may be provided obliquely upward (in the ±x direction and the +y direction) or obliquely downward (in the ±x direction and the −y direction) of the terminal part 13b.

The returning wire 14 will be described in detail later.

As described above, the sensitive circuit 12 is configured so that the sensitive parts 121 are windingly connected in series by the connection parts 122, and the high-frequency currents flow from the terminal parts 13a and 13b provided at both end portions of the connected sensitive parts 121. Therefore, since the circuit is the path through which high-frequency current flows, the circuit is referred to as the sensitive circuit 12.

Description will be given of the cross-sectional structure of the magnetic sensor 10 by the cross-sectional view in FIG. 3B. Here, illustration of the returning wire 14 is omitted, and the description will focus on the structure of the sensitive circuit 12.

As described above, the magnetic sensor 10 includes the substrate 11, and the sensitive circuit 12 provided on the substrate 11. The sensitive circuit 12 includes, as an example, four soft magnetic material layers 111a, 111b, 111c, and 111d from the substrate 11 side. Then, the sensitive circuit 12 includes, between the soft magnetic material layer 111a and the soft magnetic material layer 111b, a magnetic domain suppression layer 112a that suppresses occurrence of a closure magnetic domain in the soft magnetic material layer 111a and the soft magnetic material layer 111b. Further, the sensitive circuit 12 includes, between the soft magnetic material layer 111c and the soft magnetic material layer 111d, a magnetic domain suppression layer 112b that suppresses occurrence of a closure magnetic domain in the soft magnetic material layer 111c and the soft magnetic material layer 111d. Also, the sensitive circuit 12 includes, between the soft magnetic material layer 111b and the soft magnetic material layer 111c, a conductor layer 113 that reduces resistance (here, refer to the electrical resistance) of the sensitive circuit 12. In the case where the soft magnetic material layers 111a, 111b, 111c, and 111d are not distinguished, the layers are referred to as the soft magnetic material layers 111. In the case where the magnetic domain suppression layers 112a and 112b are not distinguished, the layers are referred to as the magnetic domain suppression layers 112.

The substrate 11 is composed of a non-magnetic material; for example, an electrically-insulated oxide substrate, such as glass or sapphire, a semiconductor substrate, such as silicon, or a metal substrate, such as aluminum, stainless steel, or a nickel-phosphorus-plated metal. Note that, in the case where the substrate 11 is composed of a semiconductor substrate, such as silicon, or a metal substrate, such as aluminum, stainless steel, or a nickel-phosphorus-plated metal, and has high conductivity, an insulating material layer to electrically insulate the substrate 11 from the sensitive circuit 12 may be provided on the surface of the substrate 11 on which the sensitive circuit 12 is to be provided. Specific examples of the insulating material constituting the insulating material layer include oxide, such as $SiO_2$, $Al_2O_3$, or $TiO_2$, or nitride, such as $Si_3N_4$ or AlN. Here, description will be given on the assumption that the substrate 11 is made of glass. The thickness of such a substrate 11 is, for example, 0.3 mm to 2 mm. Note that the thickness of the substrate 11 may have other values.

The soft magnetic material layer 111 is configured with a soft magnetic material of an amorphous alloy showing the magnetic impedance effect. As the soft magnetic material constituting the soft magnetic material layer 111, an amorphous alloy, which is an alloy containing Co as a main component doped with a high melting point metal, such as Nb, Ta or W, may be used. Examples of such an alloy containing Co as a main component include CoNbZr, CoFeTa, CoWZr, and CoFeCrMnSiB. The thickness of the soft magnetic material layer 111 is, for example, 100 nm to 1 μm.

Here, the soft magnetic material has a small, so-called coercive force, the soft magnetic material being easily magnetized by an external magnetic field, but, upon removal of the external magnetic field, quickly returning to a state with no magnetization or a little magnetization.

In addition, in this specification, amorphous alloys and amorphous metals refer to those having structures that do not have a regular arrangement of atoms such as crystals, which are formed by the sputtering method, etc.

The magnetic domain suppression layer 112 prevents the closure magnetic domain from being generated in the upper and lower soft magnetic material layers 111 that sandwich the magnetic domain suppression layer 112.

In general, in the soft magnetic material layer 111, plural magnetic domains with different directions of magnetization are likely to be formed. In this case, a closure magnetic domain showing annular-shaped magnetization direction is formed. As the external magnetic field is increased, the magnetic domain walls are displaced; thereby the area of the magnetic domain with the magnetization direction that is the same as the direction of the external magnetic field is increased, whereas the area of the magnetic domain with the magnetization direction that is opposite to the direction of the external magnetic field is decreased. Then, as the external magnetic field is further increased, in the magnetic domain where the magnetization direction is different from the direction of the external magnetic field, magnetization rotation is generated so that the magnetization direction is the same as the direction of the external magnetic field. Finally, the magnetic domain wall that existed between the adjacent magnetic domains disappears and the adjacent magnetic domains become a magnetic domain (a single magnetic domain). In other words, when the closure magnetic domain is formed, as the external magnetic field changes, the Barkhausen effect, in which the magnetic domain walls constituting the closure magnetic domain are displaced in a stepwise and discontinuous manner, is generated. The discontinuous displacement of the magnetic domain walls result in noise in the magnetic sensor 10, which causes a risk of reduction in S/N in the output obtained from the magnetic sensor 10. The magnetic domain suppression layer 112 suppresses formation of plural magnetic domains with small areas in the soft magnetic material layers 111 provided on upper and lower sides of the magnetic domain suppression layer 112. This suppresses the formation of the closure magnetic domain and suppresses the noise generated by discontinuous displacement of the magnetic domain walls. Note that, in the case where the magnetic domain suppression layer 112 is provided, it is better to have less magnetic domains to be formed, that is, the effect of increasing the size of the magnetic domains can be obtained, as compared to the case where the magnetic domain suppression layer 112 is not provided.

Examples of materials of such a magnetic domain suppression layer 112 include non-magnetic materials, such as Ru and $SiO_2$, and non-magnetic amorphous metals, such as CrTi, AlTi, CrB, CrTa, and CoW. The thickness of such a magnetic domain suppression layer 112 is, for example, 10 nm to 100 nm.

The conductor layer 113 reduces the resistance of the sensitive circuit 12. In other words, the conductor layer 113 has conductivity higher than that of the soft magnetic material layer 111, and reduces the resistance of the sensitive circuit 12, as compared to the case where the conductive layer 113 is not included. The magnetic field is detected by the change in the impedance (hereinafter, referred to as the impedance Z, and the change in the impedance is referred to as $\Delta Z$) when the alternating current is passed between the two terminal parts 13a and 13b of the sensitive circuit 12. On this occasion, as the frequency of the alternating current is higher, the rate of change in the impedance Z with respect to the change in the external magnetic field $\Delta Z/\Delta H$ (hereinafter, referred to as the impedance change rate $\Delta Z/\Delta H$) (the change in the external magnetic field is referred to as $\Delta H$) is increased. However, if the frequency of the alternating current is increased without including the conductor layer 113, the impedance change rate $\Delta Z/\Delta H$ is reduced by the floating capacitance. Consequently, the conductor layer 113 is provided to reduce the resistance of the sensitive circuit 12.

As such a conductor layer 113, it is preferable to use metal or an alloy having high conductivity, and is more preferable to use metal or an alloy that is highly conductive and non-magnetic. Examples of materials of such a conductor layer 113 include metal, such as Ag, Al, and Cu. The thickness of the conductor layer 113 is, for example, 10 nm to 1 μm. It is sufficient that the conductor layer 113 can reduce the resistance of the sensitive circuit 12, as compared to the case where the conductor layer 113 is not included.

Note that the upper and lower soft magnetic material layers 111 sandwiching the magnetic domain suppression layer 112 and the upper and lower soft magnetic material layers 111 sandwiching the conductor layer 113 are antiferromagnetically coupled (AFC) with each other. Due to the upper and lower soft magnetic material layers 111 that are antiferromagnetically coupled, occurrence of demagnetizing fields is suppressed and the sensitivity of the magnetic sensor 10 is improved.

(Operation of Magnetic Sensor 10)

Subsequently, operation of the magnetic sensor 10 will be described.

Figure 4:
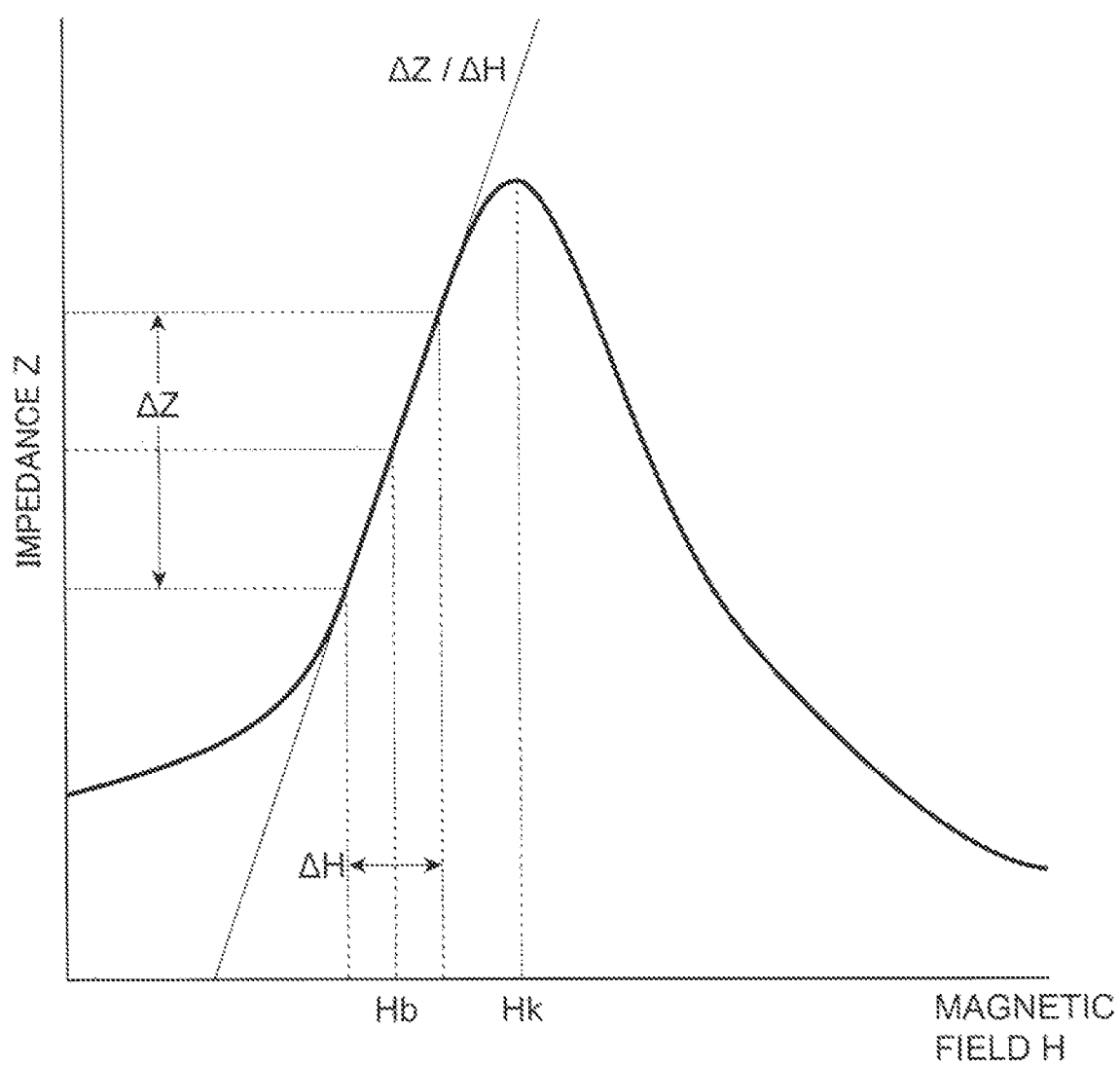
FIG. 4 is a diagram illustrating a relation between a magnetic field applied in the longitudinal direction of a sensitive part of the magnetic sensor and an impedance of the magnetic sensor.

FIG. 4 is a diagram illustrating a relation between the magnetic field H applied in the longitudinal direction of the sensitive part 121 of the magnetic sensor 10 and the impedance Z of the magnetic sensor 10. In FIG. 4, the horizontal axis indicates the magnetic field H, and the vertical axis indicates the impedance Z. Note that the impedance Z is measured by passing the alternating current between the terminal parts 13b and 13c of the sensitive circuit 12 shown in FIG. 3A. Therefore, though the impedance Z is the impedance of the sensitive circuit 12, it is also referred to as the impedance Z of the magnetic sensor 10.

As shown in FIG. 4, the impedance Z of the magnetic sensor 10 is increased as the magnetic field H to be applied in the longitudinal direction of the sensitive parts 121 is increased. Then, the impedance Z of the magnetic sensor 10 is reduced when the magnetic field H to be applied becomes larger than the anisotropic magnetic field Hk. Within the range in which the magnetic field H to be applied is smaller than the anisotropic magnetic field Hk of the sensitive parts 121, by use of a portion where the amount of variations $\Delta Z$ in the impedance Z with respect to the amount of variations $\Delta H$ in the magnetic field H is steep ($\Delta Z/\Delta H$ is large), it is possible to extract extremely weak variations in the magnetic field H as the amount of variations $\Delta Z$ in the impedance Z. In FIG. 4, the center of the magnetic field H where $\Delta Z/\Delta H$ is large is shown as the magnetic field Hb. In other words, it is possible to measure the amount of change ($\Delta H$) in the magnetic field H in the vicinity to the magnetic field Hb (the range indicated by arrows in FIG. 4) with high accuracy. Here, in the portion where the amount of changes $\Delta Z$ in the impedance Z is the steepest ($\Delta Z/\Delta H$ is the largest), the magnetic impedance effect becomes larger and the magnetic field or changes in the magnetic field can be easily measured. To put it another way, the sensitivity becomes higher as the changes in the impedance Z with respect to the magnetic field H are steeper. The magnetic field Hb is referred to as a bias magnetic field in some cases. Hereinafter, the magnetic field Hb is referred to as the bias magnetic field Hb. Note that, as the frequency of the alternating current applied to the sensitive circuit 12 is higher, the sensitivity becomes higher.

(Method of Manufacturing Magnetic Sensor 10)

The magnetic sensor 10 is manufactured as follows.

First, on the substrate 11, a photoresist pattern to cover portions excluding the planar shape of the sensitive circuit 12 is formed by using the photolithography technique that is publicly known. Subsequently, on the substrate 11, the soft magnetic material layer 111a, the magnetic domain suppression layer 112a, the soft magnetic material layer 111b, the conductor layer 113, the soft magnetic material layer 111c, the magnetic domain suppression layer 112b, and the soft magnetic material layer 111d are deposited in this order by, for example, the sputtering method. Then, the soft magnetic material layer 111a, the magnetic domain suppression layer 112a, the soft magnetic material layer 111b, the conductor layer 113, the soft magnetic material layer 111c, the magnetic domain suppression layer 112b, and the soft magnetic material layer 111d deposited on the photoresist are removed with the photoresist. Consequently, on the substrate 11, a laminated body configured with the soft magnetic material layer 111a, the magnetic domain suppression layer 112a, the soft magnetic material layer 111b, the conductor layer 113, the soft magnetic material layer 111c, the magnetic domain suppression layer 112b, and the soft magnetic material layer 111d processed into the planar shape of the sensitive circuit 12 is left. In other words, the magnetic sensor 10 is formed.

As described above, the soft magnetic material layer 111 is provided with uniaxial magnetic anisotropy in a direction crossing the longitudinal direction, for example, the short direction (the y direction in FIG. 3A). The uniaxial magnetic anisotropy can be imparted by performing, for example, the heat treatment at 400° C. in a rotating magnetic field of 3 kG (0.3 T) (heat treatment in the rotating magnetic field) and the heat treatment at 400° C. in a static magnetic field of 3 kG (0.3 T) (heat treatment in the static magnetic field) subsequent thereto on the sensitive circuit 12 formed on the substrate 11. Impartation of the uniaxial magnetic anisotropy may be performed in depositing the soft magnetic material layers 111 constituting the sensitive circuit 12 by use of a magnetron sputtering method, instead of being performed in the heat treatment in the rotating magnetic field and heat treatment in the static magnetic field. In other words, by the magnetic field formed by the magnets used in the magnetron sputtering method, the soft magnetic material layers 111 are deposited, and at the same time, the uniaxial magnetic anisotropy is imparted to the soft magnetic material layers 111.

In the manufacturing method described above, the connection parts 122 in the sensitive circuit 12 are formed simultaneously with the sensitive parts 121. Note that the photoresist pattern may be formed by regarding a portion excluding the planar shape of the sensitive circuit 12 as a portion excluding the planar shape of the sensitive circuit 12 and the terminal parts 13. In this case, the terminal parts 13 are formed simultaneously with the sensitive parts 121 and the connection parts 122. In addition, the connection parts 122 and the terminal parts 13 may be formed with a metal having conductivity, such as Al, Cu, Ag, or Au. Moreover, the metal having conductivity, such as Al, Cu, Ag, or Au, may be laminated on the connection parts 122 and the terminal parts 13 that are formed simultaneously with the sensitive parts 121.

Note that the sensitive circuit 12 was assumed to include the magnetic domain suppression layer 112 and the conductor layer 113; however, it is not necessary to include the magnetic domain suppression layer 112, or the conductor layer 113, or both.

(Magnetic Sensor 10 to which the First Exemplary Embodiment is Applied and Magnetic Sensor Device 1)

Next, the magnetic sensor 10 to which the first exemplary embodiment is applied and the magnetic sensor device 1 will be described.

As described above, as the area of the current loop α formed by the wire in the neighborhood of the magnetic sensor 10 is reduced, the inductance is reduced and the sensitivity is improved. For this reason, in the magnetic sensor device 1 provided with the magnetic sensor 10, to which the first exemplary embodiment is applied, the terminal part 13c is provided, and the returning wire 14 connects the terminal part 13a and the terminal part 13c.

Figure 5A:
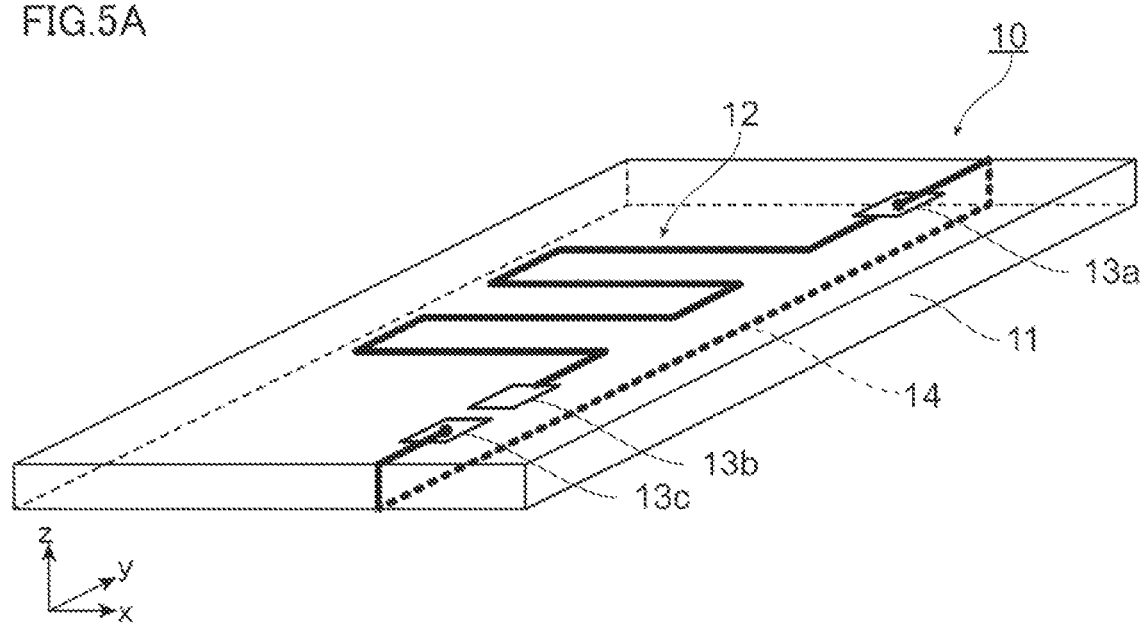
FIGS. 5A and 5B are diagrams stereoscopically illustrating the magnetic sensor to which the first exemplary embodiment is applied, where
Figure 5B:
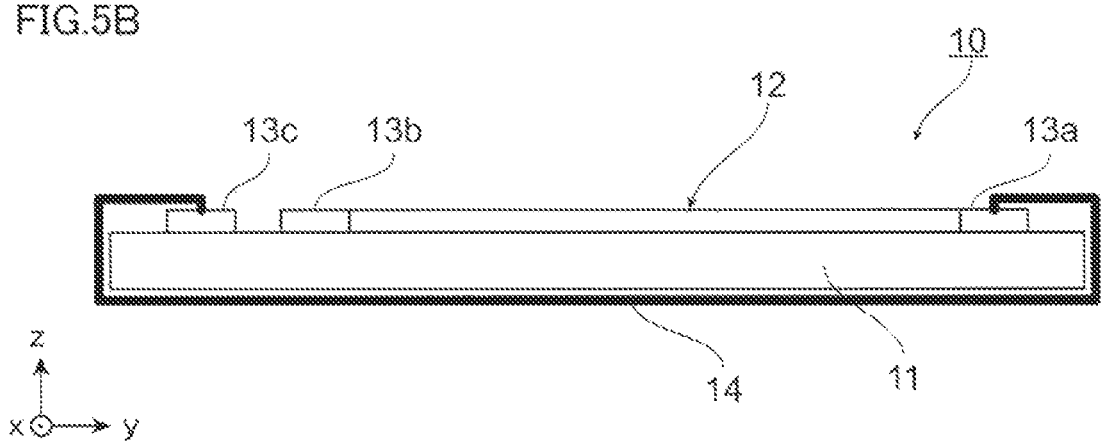

FIGS. 5A and 5B are diagrams stereoscopically illustrating the magnetic sensor 10 to which the first exemplary embodiment is applied. FIG. 5A is a perspective view, and FIG. 5B is a side elevational view showing the magnetic sensor 10 in FIG. 5A from the x direction. In FIG. 5A, the x, y and z directions are set in the same manner as FIGS. 3A and 3B. In the side elevational view in FIG. 5B, the right direction of the page is the +y direction, and the upward direction of the page is the +z direction.

As shown in FIGS. 5A and 5B, in the magnetic sensor 10, the returning wire 14 connecting the terminal part 13a and the terminal part 13c is provided to be routed to the back side of the substrate 11. Note that the returning wire 14 routed to the back side of the substrate 11 is indicated by the broken line. Then, the terminal parts 13b and 13c are connected to the connection terminals 20 and 30 of the alternating current generation part 200 and the detection part 300. The terminal parts 13b and 13c are disposed adjacent to each other. Note that the returning wire 14 is routed along the back side of the substrate 11 from the end portions of the substrate 11; however, to reduce the length of the returning wire 14, notches may be made at the portions of the substrate 11 from which the returning wire 14 is routed to the back side. It is also possible to form a through hole in the substrate 11 to route the returning wire 14 to the back side.

FIGS. 6A to 6D are diagrams showing variations of the magnetic sensor 10 to which the first exemplary embodiment is applied. Note that FIG. 6A shows the magnetic sensor 10 shown in FIGS. 3A, 3B, 5A, and 5B. To distinguish magnetic sensors of the variations, magnetic sensors 10 in FIGS. 6A to 6D are referred to as magnetic sensors 10a, 10b, 10c, and 10d, and returning wires 14 thereof are referred to as returning wires 14a, 14b, 14c, and 14d, respectively. In the case where the magnetic sensors 10a, 10b, 10c, and 10d are not distinguished from each other, each of these is referred to as the magnetic sensor 10, and, in the case where the returning wires 14a, 14b, 14c, and 14d are not distinguished from each other, each of these is referred to as the returning wire 14. The returning wire 14 hidden on the back side of the substrate 11 is indicated by the broken line. On the back side of the substrate 11, the returning wire 14 is provided along the back side of the substrate 11. Note that, in the magnetic sensors 10a, 10b, 10c, and 10d, the sensitive circuits 12 are the same.

In the magnetic sensor 10a shown in FIG. 6A, the returning wire 14a is linearly provided to head from the terminal part 13a toward the terminal part 13b at the end portion in the x direction of the sensitive circuit 12, to be connected to the terminal part 13c. The magnetic sensor 10a is referred to as "end" in some cases. Note that, in planar view, the returning wire 14a may be provided so that a part thereof overlaps the sensitive circuit 12. Planar view refers to the case in which the magnetic sensor 10 is viewed from the z direction.

In the magnetic sensor 10b shown in FIG. 6B, in planar view, the returning wire 14b is provided to cross the center portion in the x direction of the sensitive circuit 12. The magnetic sensor 10b is referred to as "center" in some cases.

In the magnetic sensor 10c shown in FIG. 6C, in planar view, the returning wire 14c is provided in an M shape to cross the sensitive circuit 12. The magnetic sensor 10c is referred to as "M shape" in some cases.

In the magnetic sensor 10d shown in FIG. 6D, in planar view, the returning wire 14d is provided to overlap the sensitive parts 121 and the connection parts 122 of the sensitive circuit 12. In other words, the returning wire 14d is identical in shape to the sensitive circuit 12. The magnetic sensor 10d is referred to as "identical" in some cases.

The direction of the high-frequency current flowing through the returning wire 14d is reversed from the direction of the high-frequency current flowing through the sensitive circuit 12, and the magnetic fields generated by those currents cancel each other. The sensitive circuit 12 is windingly configured (with a meander structure), where the magnetic fields cancel each other between the adjacent sensitive parts 121. However, in the case where the magnetic sensor 10 includes an odd number of sensitive parts 121, the magnetic fields cannot be canceled between the adjacent sensitive parts 121. In addition, the magnetic fields generated by the connection parts 122 are not canceled. Therefore, by the returning wire 14d provided to overlap the sensitive circuit 12, the magnetic fields generated by the high-frequency currents are likely to be canceled. Consequently, the S/N of the signal detected by the detection part 300 is improved.

Figure 7A:
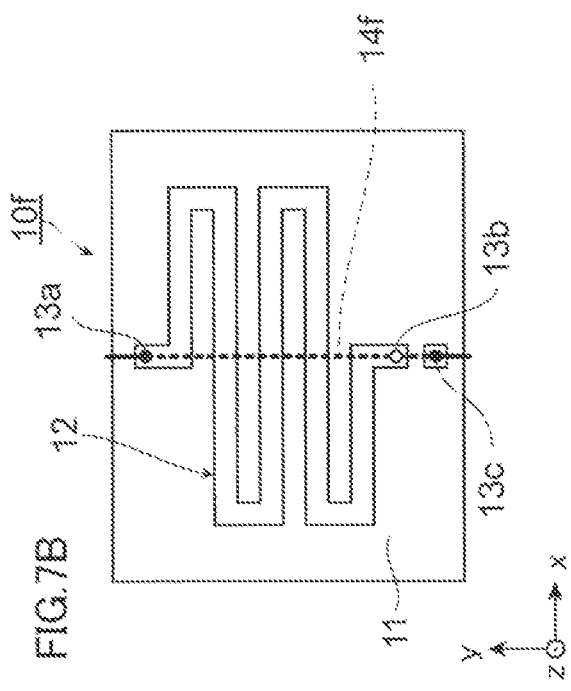
FIGS. 7A to 7C are diagrams showing other variations of the magnetic sensor to which the first exemplary embodiment is applied.
Figure 7B:
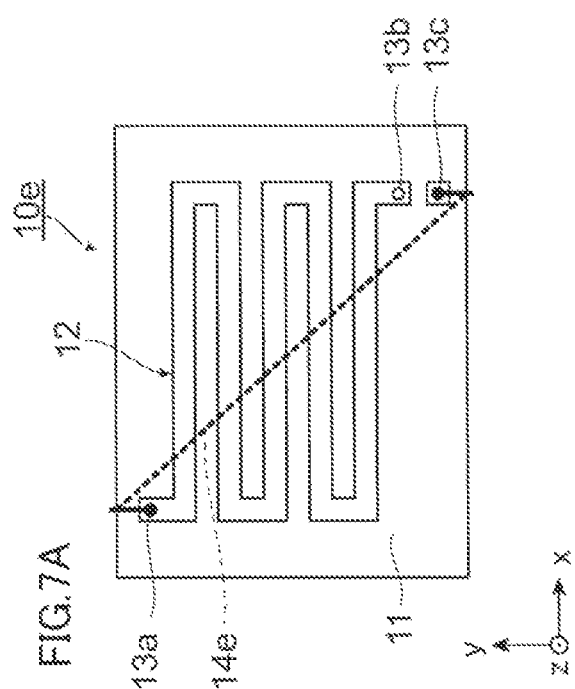
Figure 7C:
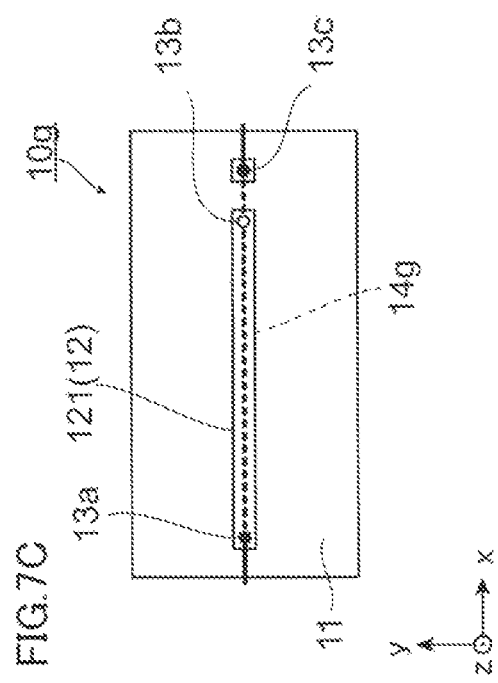

FIGS. 7A to 7C are diagrams showing other variations of the magnetic sensor 10 to which the first exemplary embodiment is applied. FIGS. 7A, 7B, and 7C refer to the magnetic sensors 10 as the magnetic sensors 10e, 10f, and 10g, and refer to the returning wires 14 as the returning wires 14e, 14f, and 14g, respectively. In the case where the magnetic sensors 10e, 10f, and 10g are not distinguished from each other, each of these is referred to as the magnetic sensor 10, and, in the case where the returning wires 14e, 14f, and 14g are not distinguished from each other, each of these is referred to as the returning wire 14. Then, the returning wire 14 hidden on the back side of the substrate 11 is indicated by the broken line. Note that, on the back side of the substrate 11, the returning wire 14 is provided along the back side of the substrate 11.

In the magnetic sensor 10e shown in FIG. 7A, the sensitive circuit 12 includes the five (an odd number) sensitive parts 121, the terminal part 13a is provided on the y direction side of the −x direction side (at the upper left corner of the paper), and the terminal part 13b is provided on the −y direction side of the x direction side (at the lower right corner of the paper). The terminal part 13c is provided adjacent to the terminal part 13b on the −y direction side. In other words, the terminal part 13a and the terminal part 13c are provided at the positions of the diagonally opposite corners in the magnetic sensor 10e. The returning wire 14e is provided from the terminal part 13a toward the terminal part 13b to diagonally cross the sensitive circuit 12 in planar view, to be connected to the terminal part 13c.

In the magnetic sensor 10f shown in FIG. 7B, the terminal parts 13a and 13b are provided at the center portion in the x direction of the sensitive circuit 12. Note that the terminal part 13c is also provided adjacent to the terminal part 13b on the −y direction side at the center portion in the x direction of the magnetic sensor 10f. The returning wire 14f is provided from the terminal part 13a toward the terminal part 13b to cross the center portion of the sensitive circuit 12 in the −y direction in planar view, to be connected to the terminal part 13c.

In the magnetic sensor 10g shown in FIG. 7C, the sensitive circuit 12 includes one sensitive part 121 having the longitudinal direction in the x direction, the terminal part 13a is provided at the end portion on the −x direction side, and the terminal part 13b is provided at the end portion on the +x direction side. The terminal part 13c is provided adjacent to the terminal part 13b on the x direction side. The returning wire 14g is provided from the terminal part 13a toward the terminal part 13b to overlap the sensitive part 121 in planar view, to be connected to the terminal part 13c.

The direction of the high-frequency current flowing through the returning wire 14g is reversed from the direction of the high-frequency current flowing through the sensitive part 121 of the sensitive circuit 12, and the magnetic fields generated by those currents cancel each other. Consequently, the S/N of the signal detected by the detection part 300 is improved.

In the magnetic sensors 10 of the variations shown in FIGS. 6A to 6D and FIGS. 7A to 7C, the terminal part 13b and the terminal part 13c are provided adjacent to each other. Therefore, the area of the current loop (the current loop α2 shown in FIG. 1A) formed by the wire connecting the magnetic sensor 10 (the terminal parts 13b and 13c) and the connection terminals 20 and 30 is reduced. Consequently, the sensitivity of the magnetic sensor 10 is improved.

Figure 8A:
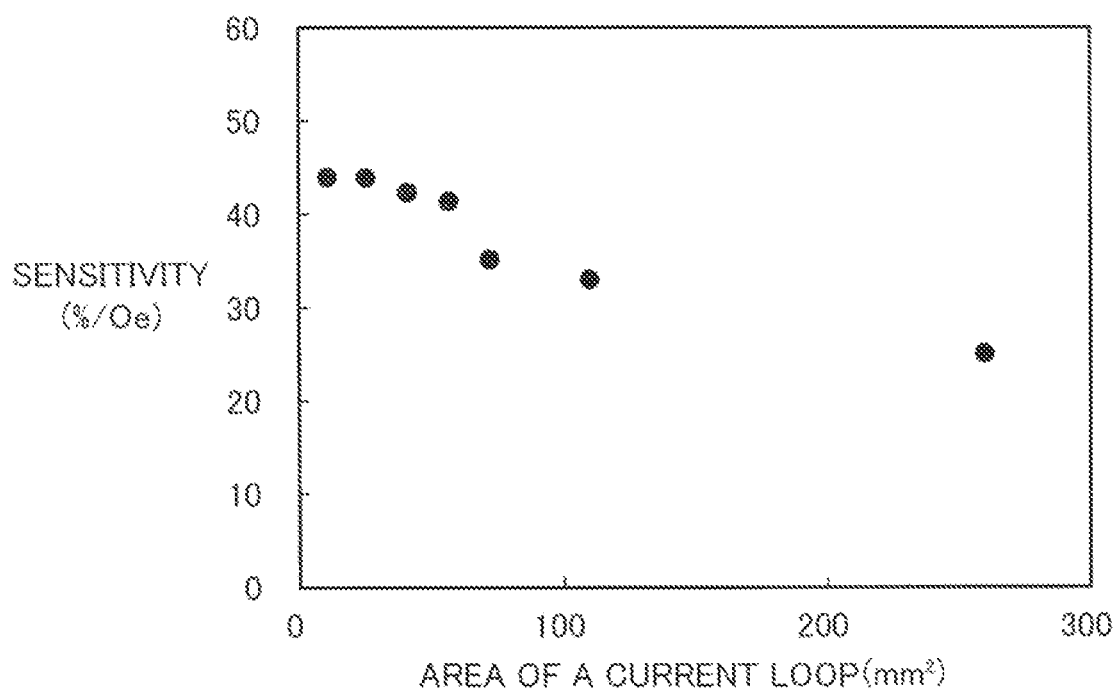
FIGS. 8A and 8B are diagrams illustrating sensitivity in the magnetic sensor, where
Figure 8B:
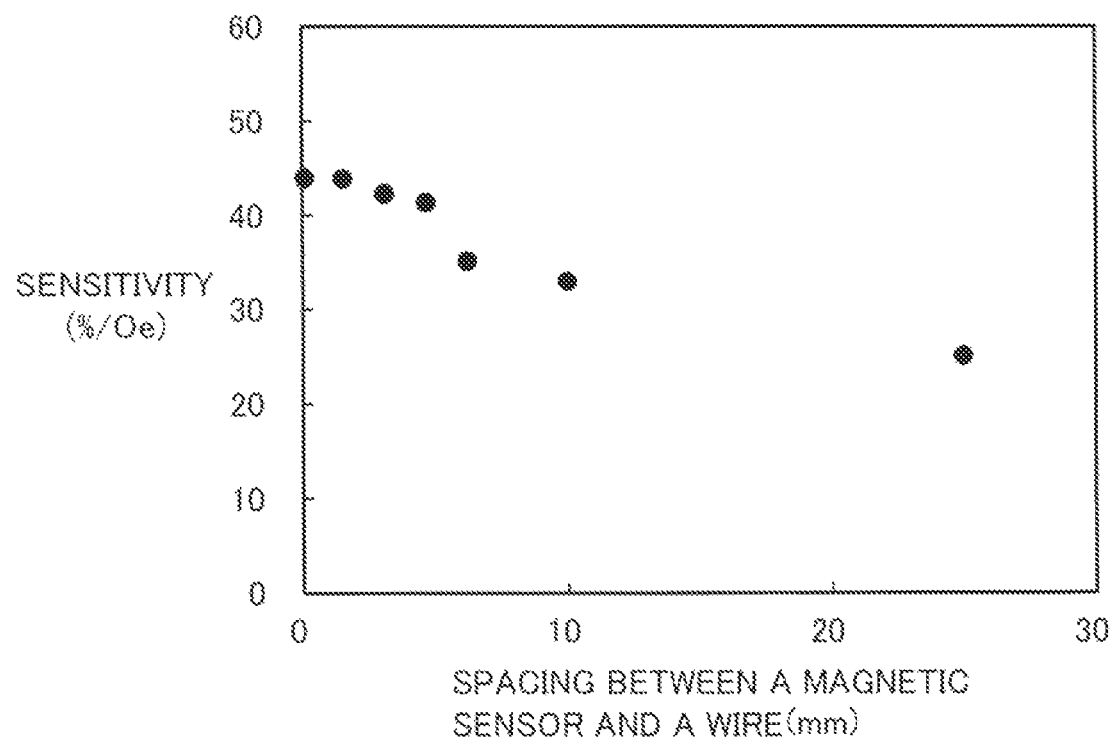

FIGS. 8A and 8B are diagrams illustrating the sensitivity in the magnetic sensor device 1 including the magnetic sensor 10. FIG. 8A shows a relation between the area of the current loop and the sensitivity, and FIG. 8B shows a relation between the spacing between the magnetic sensor and the wire and the sensitivity. In FIG. 8A, the horizontal axis is the area of the current loop (mm$^2$), and the vertical axis is the sensitivity (%/Oe). In addition, in FIG. 8B, the horizontal axis is the spacing between the magnetic sensor 10 and the wire (mm), and the vertical axis is the sensitivity (%/Oe). Note that the sensitivity (%/Oe) is the rate of change in frequency of the magnetic sensor 10 with respect to the strength of the unit signal magnetic field.

Here, the current loop is the addition of the current loop α and the current loop β in FIG. 1A, and the addition of the current loop α' and the current loop β in FIG. 1B. Then, similar to the magnetic sensor 10b shown in FIG. 6B, the area of the current loop (equivalent to the current loop α' in FIG. 1B) is changed by changing the spacing between the wire provided to be routed on the back side of the substrate 11 so as to cross the center portion of the sensitive circuit 12 (the returning wire 14b in the magnetic sensor 10b) and the substrate 11 of the magnetic sensor 10. The spacing "0.1 mm" between the magnetic sensor 10 and the wire in FIG. 8B corresponds to the spacing in the magnetic sensor 10b in FIG. 6B. The area of the current loop in the magnetic sensor device 1 at this time is 11 mm$^2$. Note that a breakdown of the area 11 mm$^2$ of the current loop shows the area 1 mm$^2$ of the current loop α formed by the wire in the neighborhood of the magnetic sensor 10b and the area 10 mm$^2$ of the current loop β formed by the wire in the neighborhood of the detection part 300. In other words, in the magnetic sensor device 1, the area of the current loop α (refer to FIG. 1A) is smaller than the area of the current loop β.

As shown in FIGS. 8A and 8B, when the spacing between the magnetic sensor and the wire increases and thereby the area of the current loop increases, the sensitivity (%/Oe) decreases. As shown in FIG. 8A, if the area of the current loop is 56.5 mm$^2$ or less, the sensitivity is 41.4%/Oe or more. On the other hand, if the area of the current loop is 72.0 mm$^2$ or more, the sensitivity is 35.2%/Oe or less. In other words, to improve the sensitivity, it is preferable that the area of the current loop is 50 mm$^2$ or less. In addition, as shown in FIG. 8B, when the spacing between the magnetic sensor 10 and the wire is 4.7 mm or less, the sensitivity is 41.4%/Oe or more. On the other hand, if the spacing between the magnetic sensor 10 and the wire becomes 6.2 mm or more, the sensitivity becomes 35.2%/Oe or less. In other words, to improve the sensitivity, it is preferable that the spacing between the magnetic sensor 10 and the wire is 5 mm or less.

Figure 9A:
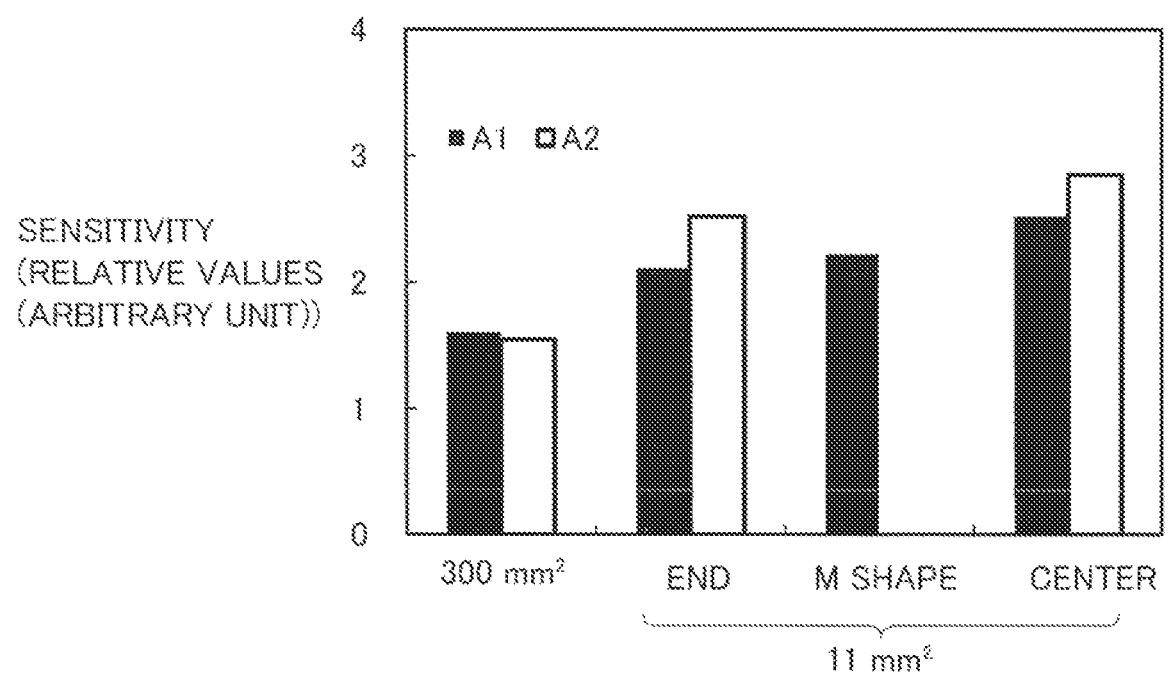
FIGS. 9A and 9B are diagrams showing sensitivity in the variations of the magnetic sensor, where
Figure 9B:
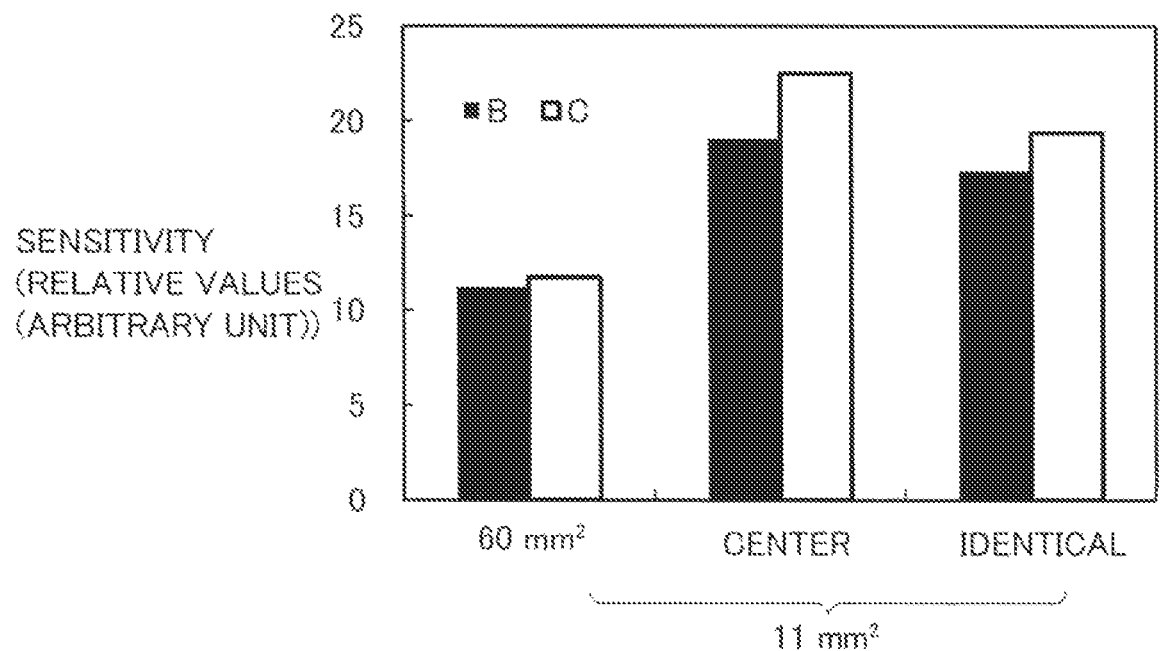

FIGS. 9A and 9B are diagrams showing the sensitivity of the magnetic sensor devices in the variations of the magnetic sensor 10. FIG. 9A shows the sensitivity measured in two samples A1 and A2 having the same structure, and FIG. 9B shows the sensitivity measured in two samples B and C having different structures. In FIG. 9A, "300 mm$^2$" is the case in which the area of the current loop is 300 mm$^2$, and the area of the current loop is increased by increasing the spacing between the magnetic sensor and the wire, as described in FIGS. 8A and 8B. The "end" indicates the magnetic sensor 10a in FIG. 6A, in which the returning wire 14a is linearly provided at the end portion of the sensitive circuit 12, the "M shape" indicates the magnetic sensor 10c in FIG. 6C, in which the returning wire 14c is provided to cross the sensitive circuit 12 in an M shape, and the "center" indicates the magnetic sensor 10b in FIG. 6B, in which the returning wire 14b is provided to cross the center portion of the sensitive circuit 12. The vertical axis is the sensitivity, but is represented in relative values (arbitrary unit).

In any of the magnetic sensor 10a ("end"), the magnetic sensor 10c ("M shape"), and the magnetic sensor 10b ("center"), the area of the current loop is 11 mm$^2$. In other words, the area of the current loop α formed by the wire in the neighborhood of each of the magnetic sensor 10a ("end"), the magnetic sensor 10c ("M shape"), and the magnetic sensor 10b ("center") is 1 mm$^2$, and the area of the current loop β formed by the wire in the neighborhood of the detection part 300 is 10 mm$^2$. In short, the area of the current loop α formed by the wire in the neighborhood of the magnetic sensor 10 is smaller than the area of the current loop β formed by the wire in the neighborhood of the detection part 300. Note that, even in the case where the area of the current loop is 300 mm$^2$, the area of the current loop β formed by the wire in the neighborhood of the detection part 300 is 10 mm$^2$. Accordingly, in the case where the area of the current loop is 300 mm$^2$, the area of the current loop formed by the wire in the neighborhood of the magnetic sensor (the current loop α' formed by the wire in the neighborhood of the magnetic sensor 10' in FIG. 1B) is larger than the area of the current loop β formed by the wire in the neighborhood of the detection part 300.

In FIG. 9B, "60 mm$^2$" is the case in which the area of the current loop is 60 mm$^2$, and the area of the current loop is increased by increasing the spacing between the magnetic sensor and the wire, as described in FIGS. 8A and 8B. The "center" indicates the magnetic sensor 10b in FIG. 6B, in which the returning wire 14b is provided to cross the center portion of the sensitive circuit 12, and the "identical" indicates the magnetic sensor 10d in FIG. 6D, in which the returning wire 14 is provided along the sensitive parts 121 and the connection parts 122 of the sensitive circuit 12. The vertical axis is the sensitivity, but is represented in relative values (arbitrary unit).

In any of the magnetic sensor 10b ("center") and the magnetic sensor 10d ("identical"), the area of the current loop is 11 mm$^2$. In other words, the area of the current loop α formed by the wire in the neighborhood of each of the magnetic sensor 10b ("center") and the magnetic sensor 10d ("identical") is 1 mm$^2$, and the area of the current loop β formed by the wire in the neighborhood of the detection part 300 is 10 mm$^2$. In short, the area of the current loop α formed by the wire in the neighborhood of the magnetic sensor 10 is smaller than the area of the current loop β formed by the wire in the neighborhood of the detection part 300. Note that, even in the case where the area of the current loop is 60 mm$^2$, the area of the current loop β formed by the wire in the neighborhood of the detection part 300 is 10 mm$^2$. Accordingly, in the case where the area of the current loop is 60 mm$^2$, the area of the current loop formed by the wire in the neighborhood of the magnetic sensor (the current loop α' formed by the wire in the neighborhood of the magnetic sensor 10' in FIG. 1B) is larger than the area of the current loop β formed by the wire in the neighborhood of the detection part 300.

As shown in FIG. 9A, in any of the "end", "M shape", and "center", the sensitivity is improved as compared to the case where the area of the current loop is 300 mm$^2$. Similarly, as shown in FIG. 9B, in any of the "center" and "identical", the sensitivity is improved as compared to the case where the area of the current loop is 60 mm$^2$.

As described above, the magnetic sensor device 1 using the magnetic sensor 10, to which the first exemplary embodiment is applied, since the area of the current loop α formed by the wire in the neighborhood of the magnetic sensor 10 is made smaller than the area of the current loop β formed by the wire in the neighborhood of the detection part 300, the sensitivity of the magnetic sensor 10 and the sensitivity of the magnetic sensor device 1 are improved.

Note that, in the above, the returning wire 14 was provided to be routed to the back side of the substrate 11; however, the returning wire 14 may be provided on the front side of the substrate 11.

Figure 10A:
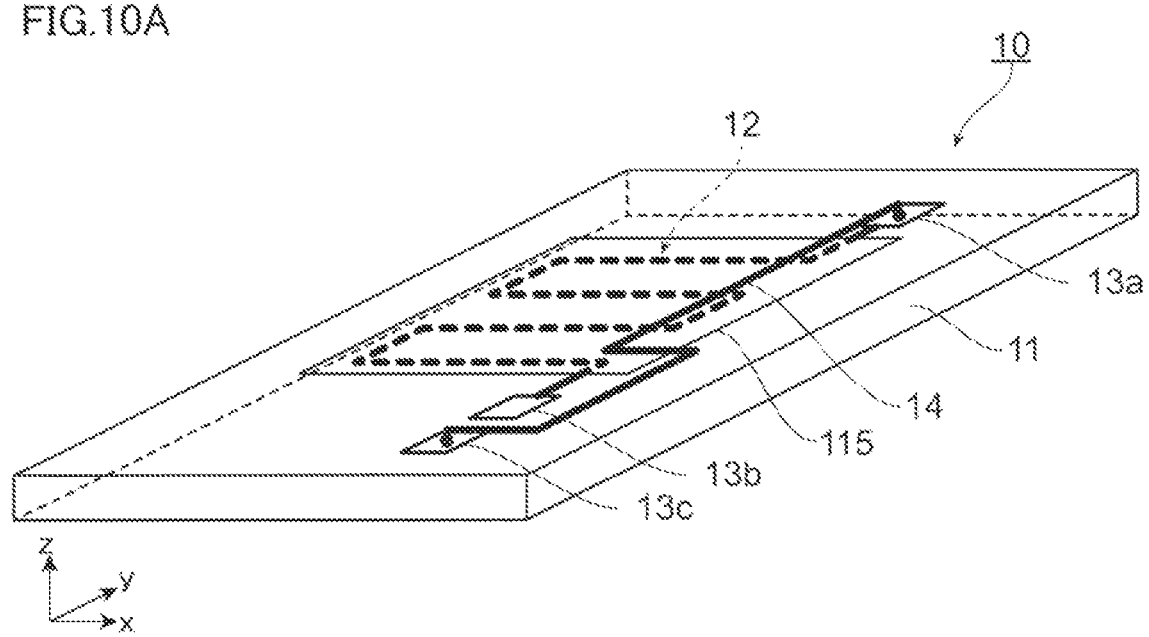
FIGS. 10A and 10B show diagrams illustrating another magnetic sensor to which the first exemplary embodiment is applied, where
Figure 10B:
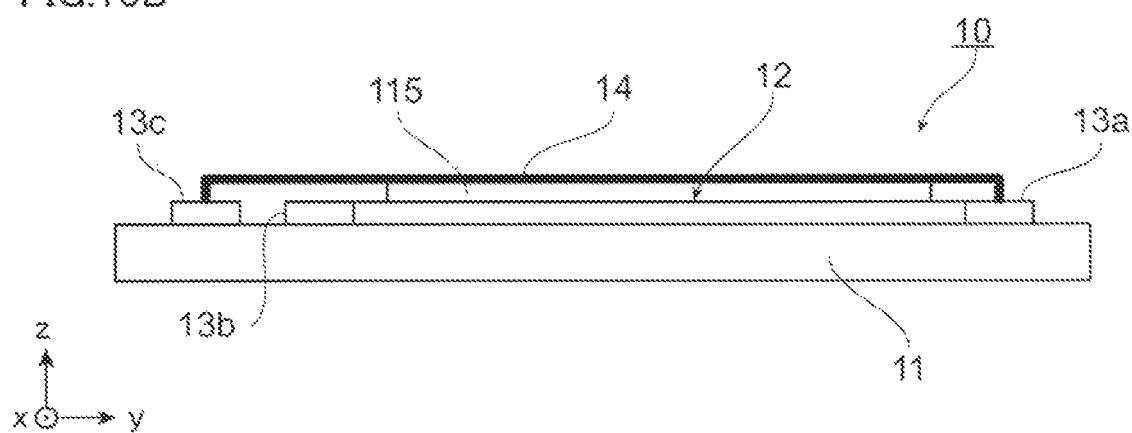

FIGS. 10A and 10B show diagrams illustrating another magnetic sensor 10 to which the first exemplary embodiment is applied. FIG. 10A is a perspective view, and FIG. 10B is a side elevational view showing the magnetic sensor 10 in FIG. 10A from the x direction. In FIG. 10A, the x, y and z directions are set in the same manner as FIGS. 5A and 5B. In the side elevational view in FIG. 10B, the right direction of the page is the +y direction, and the upward direction of the page is the +z direction.

As shown in FIGS. 10A and 10B, in the magnetic sensor 10, the returning wire 14 connecting the terminal part 13a and the terminal part 13c is provided to the front side of the substrate 11. Note that, in the returning wire 14, the portion overlapping the sensitive circuit 12 is provided with an electrically-insulated insulator layer 115, and thereby the portion (the returning wire 14) is electrically insulated from the sensitive circuit 12. Then, the returning wire 14 is provided along the surface of the insulator layer 115. Note that the returning wire 14 is provided not to overlap the terminal part 13b, but to bypass the terminal part 13b. Examples of the insulator constituting the insulator layer 115 include oxide, such as SiO$_2$, Al$_2$O$_3$, or TiO$_2$, or nitride, such as Si$_3$N$_4$ or AlN.

As shown in FIG. 10B, in the current loop α1 in the magnetic sensor 10 (refer to FIG. 1A), the returning wire 14 provided on the front side of the substrate 11 can reduce the area of the current loop formed by the returning wire 14 and the sensitive circuit 12, as compared to the case where the returning wire 14 is provided on the back side of the substrate 11. Consequently, reduction of the current loop α1 in the magnetic sensor 10 reduces the current loop α formed by the wire in the neighborhood of the magnetic sensor 10, and thereby the sensitivity of the magnetic sensor 10 and the sensitivity of the magnetic sensor device 1 are more improved.

In the above, the magnetic sensor 10 was described to include the terminal part 13c on the surface of the substrate 11. However, the terminal part 13c may be provided on the back side of the substrate 11. In addition, the terminal part 13c may also be the end portion of the returning wire 14, without providing the terminal part 13c on the substrate 11. The terminal part 13c here is assumed to include the end portion of the returning wire 14. In other words, the terminal part 13b and the terminal part 13c (including the end portion of the returning wire 14) may be provided adjacent to each other so that the current loop formed by the wire that connects the magnetic sensor 10 to the connection terminals 20 and 30 is reduced. Note that, to be adjacent may mean that, as shown in FIG. 3A, the distance D1 between the terminal part 13b and the terminal part 13c (including the end portion of the returning wire 14) is shorter than the distance D2 between the terminal part 13a and the terminal part 13b.

Second Exemplary Embodiment

In the magnetic sensor 10 to which the first exemplary embodiment is applied and the magnetic sensor device 1, the returning wire 14 of the magnetic sensor 10 was provided on the back side or the front side of the substrate 11. In the magnetic sensor 10 to which the second exemplary embodiment is applied and the magnetic sensor device, the returning wire 14 of the magnetic sensor 10 is provided on the substrate 11. Note that, in the second exemplary embodiment, the configurations other than the magnetic sensor 10 are the same as those of the first exemplary embodiment; therefore, the magnetic sensor 10, which is the different portion, will be described, and description of the other configurations will be omitted. Accordingly, the magnetic sensor device, to which the second exemplary embodiment is applied, is referred to as the magnetic sensor device 1. The configuration with the same function as the magnetic sensor 10 is assigned with the same reference sign as the magnetic sensor 10 of the first exemplary embodiment.

Figure 11A:
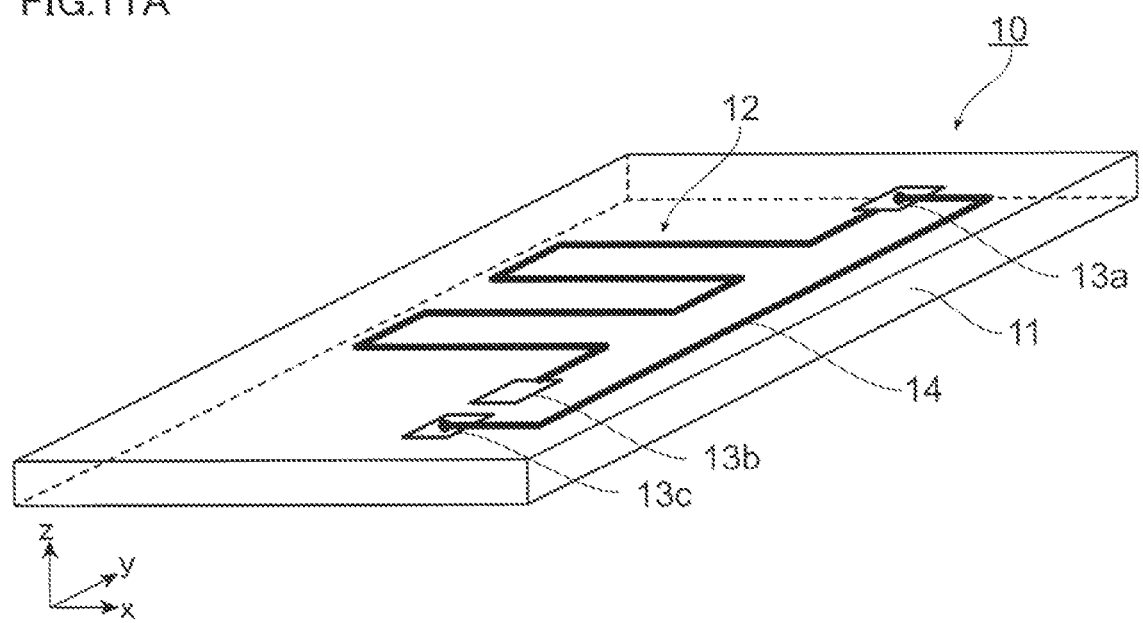
FIGS. 11A and 11B show diagrams illustrating a magnetic sensor to which a second exemplary embodiment is applied, where
Figure 11B:
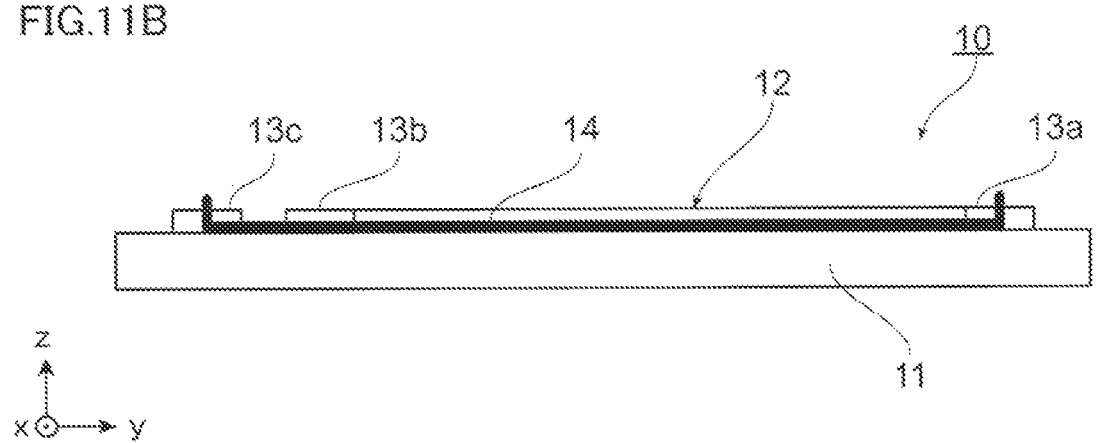

FIGS. 11A and 11B show diagrams illustrating the magnetic sensor 10 included by the magnetic sensor device 1 to which the second exemplary embodiment is applied. FIG. 11A is a perspective view, and FIG. 11B is a side elevational view showing the magnetic sensor 10 in FIG. 11A from the x direction. In FIG. 11A, the x, y and z directions are set in the same manner as FIGS. 3A and 3B. In the side elevational view in FIG. 11B, the right direction of the page is the +y direction, and the upward direction of the page is the +z direction.

In the magnetic sensor 10, the returning wire 14 is provided on the substrate 11 on the x direction side of the sensitive circuit 12.

Figure 12A:
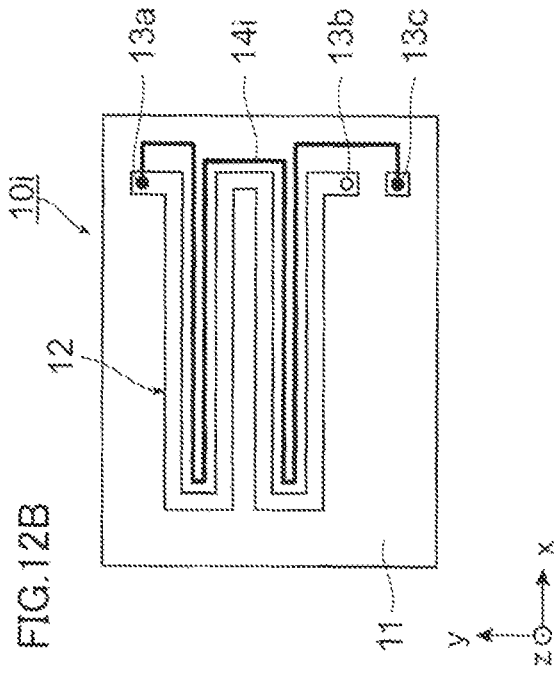
FIGS. 12A to 12C are diagrams showing variations of the magnetic sensor to which the second exemplary embodiment is applied.
Figure 12B:
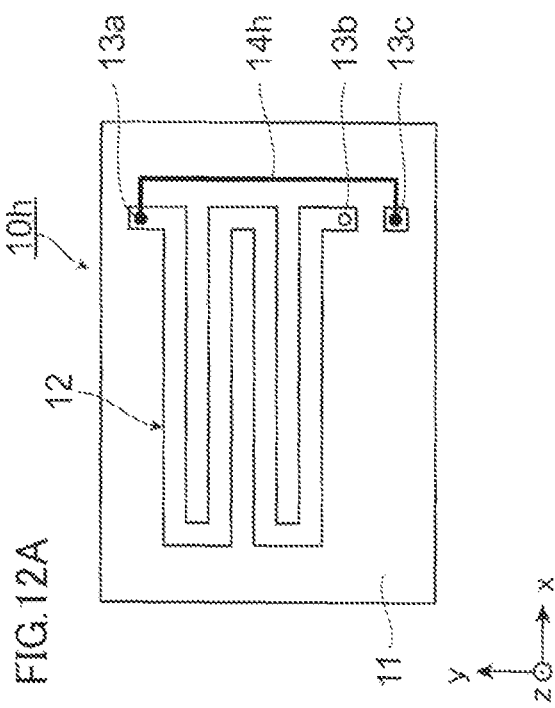
Figure 12C:
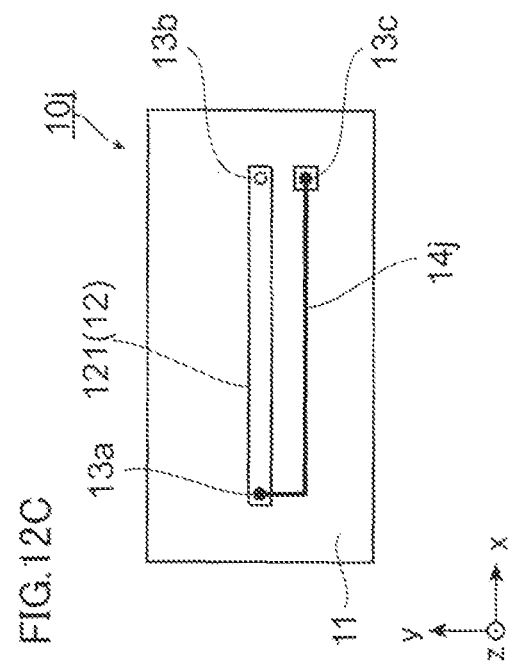

FIGS. 12A to 12C are diagrams showing variations of the magnetic sensor 10 included by the magnetic sensor device 1 to which the second exemplary embodiment is applied. Note that, to distinguish magnetic sensors of the variations, magnetic sensors 10 in FIGS. 12A to 12C are referred to as magnetic sensors 10h, 10i, and 10j, and returning wires 14 thereof are referred to as returning wires 14h, 14i, and 14j, respectively. In the case where the magnetic sensors 10h, 10i, and 10j are not distinguished from each other, each of these is referred to as the magnetic sensor 10, and, in the case where the returning wires 14h, 14i, and 14j are not distinguished from each other, each of these is referred to as the returning wire 14.

In the magnetic sensor 10h shown in FIG. 12A, the returning wire 14h is provided to linearly return back from the terminal part 13a toward the terminal part 13b along the x direction of the sensitive circuit 12, to be connected to the terminal part 13c.

In the magnetic sensor 10i shown in FIG. 12B, the returning wire 14i is provided along the sensitive parts 121 and the connection parts 122 of the sensitive circuit 12, to be connected to the terminal part 13c.

In the magnetic sensor 10i, the direction of the high-frequency current flowing through the sensitive circuit 12 is reversed from the direction of the high-frequency current flowing through the returning wire 14i. Therefore, as described in FIG. 6D, the magnetic fields produced by the high frequency currents cancel each other. Consequently, the S/N of the signal detected by the detection part 300 is improved.

In the magnetic sensor 10j shown in FIG. 12C, the sensitive circuit 12 is configured with one sensitive part 121 having the longitudinal direction in the x direction. Then, the returning wire 14j is provided to return back from the terminal part 13a toward the terminal part 13b along the sensitive part 121, to be connected to the terminal part 13c. Since the sensitive part 121 of the sensitive circuit 12 and the returning wire 14j are disposed in parallel, the direction of the high-frequency current flowing through the sensitive part 121 of the sensitive circuit 12 is reversed from the direction of the high-frequency current flowing through the returning wire 14j, and the magnetic fields generated by those currents cancel each other. Consequently, the S/N of the signal detected by the detection part 300 is improved.

In the magnetic sensors 10 of the variations shown in FIGS. 12A to 12C, the terminal part 13b and the terminal part 13c are provided adjacent to each other. Therefore, the area of the current loop (the current loop α2 shown in FIG. 1A) formed by the wire connecting the magnetic sensor 10 (the terminal parts 13b and 13c) and the connection terminals 20 and 30 is reduced. Consequently, the sensitivity of the magnetic sensor 10 and the sensitivity of the magnetic sensor device 1 including the magnetic sensor 10 are improved.

In the above, the magnetic sensor 10 was described to include the terminal part 13c on the surface of the substrate 11. However, the terminal part 13c may also be the end portion of the returning wire 14, without providing the terminal part 13c on the substrate 11. The terminal part 13c here is assumed to include the end portion of the returning wire 14. In other words, the terminal part 13b and the terminal part 13c (including the end portion of the returning wire 14) may be provided adjacent to each other so that the current loop formed by the wiring that connects the magnetic sensor 10 to the connection terminals 20 and 30 is reduced.

Third Exemplary Embodiment

In the first and second exemplary embodiments, the returning wire 14 was provided in the magnetic sensor 10, and thereby the area of the current loop formed by the wire that connects the magnetic sensor 10 and the connection terminals 20 and 30 (the current loop α2 shown in FIG. 1A) was reduced. In the third exemplary embodiment, instead of the returning wire 14, the sensitive circuit 12 is provided to return back. Note that, in the third exemplary embodiment, the configurations other than the magnetic sensor 10 are the same as those of the first and second exemplary embodiments; therefore, the magnetic sensor 10, which is the different portion, will be described, and description of the other configurations will be omitted. Accordingly, the magnetic sensor device, to which the third exemplary embodiment is applied, is referred to as the magnetic sensor device 1. Note that the configuration with the same function as the magnetic sensor 10 is assigned with the same reference sign as the magnetic sensor 10 of the first and second exemplary embodiments.

Figure 13:
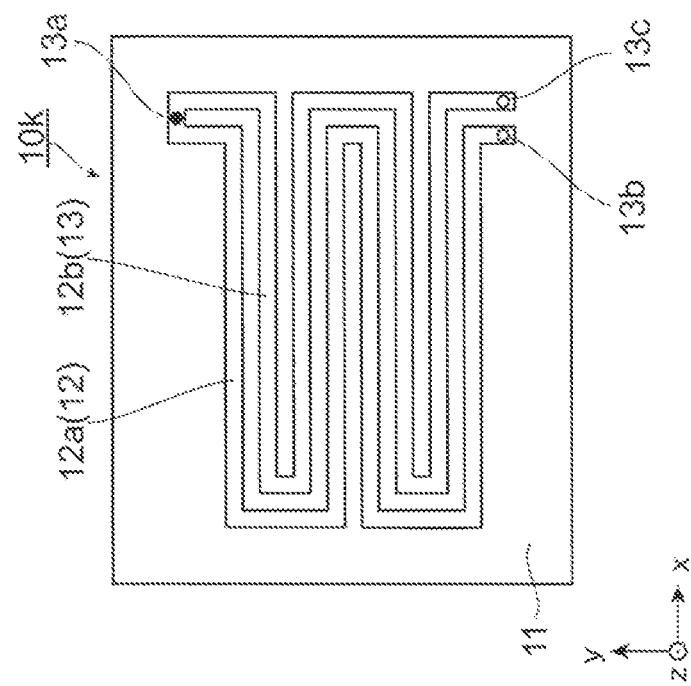
FIG. 13 is a diagram showing a variation of a magnetic sensor to which a third exemplary embodiment is applied.

FIG. 13 is a diagram showing a variation of the magnetic sensor 10 to which the third exemplary embodiment is applied. To distinguish the magnetic sensor 10 shown in FIG. 13 from the magnetic sensors 10 that have been described, the magnetic sensor 10 in FIG. 13 is referred to as a magnetic sensor 10k.

The magnetic sensor 10k shown in FIG. 13 includes sensitive circuits 12a and 12b. The sensitive circuit 12a is provided outside, and the sensitive circuit 12b is provided inside. Then, the terminal part 13a is provided at the end portion in the y direction of the sensitive circuit 12a, and the terminal part 13b is provided at the end portion in the -y direction of the sensitive circuit 12a. The terminal part 13a of the sensitive circuit 12a is connected to the sensitive circuit 12b. The terminal part 13c is provided at the end portion in the -y direction of the sensitive circuit 12b. Then, the terminal part 13b and the terminal part 13c are provided adjacent to each other. In other words, instead of the returning wire 14 in the first and second exemplary embodiments, the sensitive circuit 12b is provided. The sensitive circuit 12b is another example of other sensitive circuits and returning members. Note that it is unnecessary to provide the terminal part 13a if the sensitive circuit 12a and the sensitive circuit 12b are continuously provided.

In the magnetic sensor 10k, the direction of the high-frequency current flowing through the sensitive circuit 12a is reversed from the direction of the high-frequency current flowing through the sensitive circuit 12b. Therefore, as described in FIG. 6D, the magnetic fields produced by the high-frequency currents cancel each other. Consequently, the S/N of the signal detected by the detection part 300 is improved.

In the magnetic sensor 10k of the variation shown in FIG. 13, the terminal part 13b and the terminal part 13c are provided adjacent to each other. Therefore, the area of the current loop (the current loop α2 shown in FIG. 1A) formed by the wire connecting the magnetic sensor 10k (the terminal parts 13b and 13c) and the connection terminals 20 and 30 is reduced. Consequently, the sensitivity of the magnetic sensor 10k and the sensitivity of the magnetic sensor device 1 including the magnetic sensor 10k are improved.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The exemplary embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A magnetic sensor comprising:
   a non-magnetic substrate;
   a sensitive circuit provided on a surface of the substrate and including a sensitive part sensing a magnetic field by a magnetic impedance effect;
   a first terminal part and a second terminal part connected to respective both end portions of the sensitive circuit;
   a conductive returning member with one end portion being connected to the first terminal part, the returning member returning back toward the second terminal part; and
   a third terminal part provided adjacent to the second terminal part, wherein
   the other end portion of the returning member is connected to the third terminal part.

2. The magnetic sensor according to claim 1, wherein the returning member is a wire configured with a non-magnetic metal.

3. The magnetic sensor according to claim 1, wherein a distance between a center of the second terminal part and a center of the third terminal part is smaller than a distance between a center of the first terminal part and the center of the second terminal part.

4. The magnetic sensor according to claim 3, wherein the returning member is provided on a front side or a back side of the substrate.

5. The magnetic sensor according to claim 4, wherein the returning member is linearly provided from the first terminal part toward the second terminal part.

6. The magnetic sensor according to claim 4, wherein the returning member has a portion crossing a center portion of the sensitive circuit in planar view.

7. The magnetic sensor according to claim 4, wherein the returning member is in an M shape, and is provided to have at least a part overlapping the sensitive circuit in planar view.

8. The magnetic sensor according to claim 4, wherein the returning member is provided along the sensitive circuit.

9. The magnetic sensor according to claim 3, wherein the returning member is provided on the surface of the substrate.

10. The magnetic sensor according to claim 9, wherein the returning member is linearly provided from the first terminal part toward the second terminal part along a side surface of the sensitive circuit.

11. The magnetic sensor according to claim 9, wherein the returning member is provided along the sensitive circuit.

12. The magnetic sensor according to claim 1, wherein the returning member is another sensitive circuit including another sensitive part sensing a magnetic field by a magnetic impedance effect.

13. A magnetic sensor device comprising:
    a magnetic sensor sensing a magnetic field by a magnetic impedance effect; and
    a detection part detecting a change in impedance of the magnetic sensor, wherein
    an area of a current loop formed by a wire between the magnetic sensor and connection terminals is smaller than an area of a current loop formed by a wire between the connection terminals and the detection part.

14. The magnetic sensor device according to claim 13, wherein an inductance generated by the current loop formed by the wire between the magnetic sensor and the connection terminals and the current loop formed by the wire between the connection terminals and the detection part is equal to or less than 50% of an inductance of the magnetic sensor.

15. The magnetic sensor according to claim 1, wherein the conductive returning member is provided on a back side of the substrate.

* * * * *